(12) United States Patent
Yoshida et al.

(10) Patent No.: US 9,536,905 B2
(45) Date of Patent: Jan. 3, 2017

(54) ACTIVE MATRIX SUBSTRATE AND DISPLAY DEVICE USING SAME

(71) Applicant: Sharp Kabushiki Kaisha, Osaka-shi, Osaka (JP)

(72) Inventors: Masahiro Yoshida, Osaka (JP); Isao Ogasawara, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/438,697

(22) PCT Filed: Nov. 1, 2013

(86) PCT No.: PCT/JP2013/079722
§ 371 (c)(1),
(2) Date: Apr. 27, 2015

(87) PCT Pub. No.: WO2014/073483
PCT Pub. Date: May 15, 2014

(65) Prior Publication Data
US 2015/0255487 A1  Sep. 10, 2015

(30) Foreign Application Priority Data
Nov. 8, 2012 (JP) .................................. 2012-246028

(51) Int. Cl.
*H01L 21/70* (2006.01)
*H01L 27/12* (2006.01)
(Continued)

(52) U.S. Cl.
CPC .......... *H01L 27/124* (2013.01); *G02F 1/1345* (2013.01); *G02F 1/1368* (2013.01);
(Continued)

(58) Field of Classification Search
CPC ..................................................... H01L 27/124
See application file for complete search history.

(56) References Cited

U.S. PATENT DOCUMENTS

| 2001/0030635 A1 | 10/2001 | Kodate et al. |
| 2007/0018680 A1 | 1/2007 | Jeon et al. |

(Continued)

FOREIGN PATENT DOCUMENTS

| JP | 07-333275 A | 12/1995 |
| JP | 2001-265248 A | 9/2001 |

(Continued)

OTHER PUBLICATIONS

Official Communication issued in International Patent Application No. PCT/JP2013/079722, mailed on Jan. 28, 2014.

*Primary Examiner* — Andy Huynh
*Assistant Examiner* — Sitaramarao S Yechuri
(74) *Attorney, Agent, or Firm* — Keating & Bennett, LLP

(57) ABSTRACT

An active matrix substrate (5) includes mounting terminals (DT) for supplying a signal from a driver, draw-out lines (22) connecting the mounting terminals (DT) and gate bus lines (G) or data bus lines (D), first common wires (24) connected in common to the plurality of gate bus lines (G) or the plurality of data bus lines (D), and second switching elements (23) connected between the draw-out lines (22) and the first common wires (24). The draw-out lines (22) include a fan-out portion (FA) that is arranged at an angle with respect to a direction of arrangement of the gate bus lines (G) or the data bus lines (D). At least a portion of the first common wires (24) and at least a portion of the second switching elements (23) are arranged between the fan-out portion (FA) and the mounting terminals (DT).

12 Claims, 18 Drawing Sheets

(51) Int. Cl.
　　　*G02F 1/1362*　　(2006.01)
　　　*G02F 1/1345*　　(2006.01)
　　　*G02F 1/1368*　　(2006.01)
　　　*H01L 29/786*　　(2006.01)

(52) U.S. Cl.
　　　CPC .... *G02F 1/136286* (2013.01); *H01L 27/1225* (2013.01); *H01L 27/1248* (2013.01); *H01L 29/7869* (2013.01); *H01L 29/78633* (2013.01); *G02F 2001/13456* (2013.01); *G02F 2001/13629* (2013.01); *G02F 2001/136254* (2013.01)

(56) References Cited

U.S. PATENT DOCUMENTS

| | | | |
|---|---|---|---|
| 2008/0007667 A1 | 1/2008 | Nakayama | |
| 2008/0117345 A1 | 5/2008 | Ishii et al. | |
| 2008/0251787 A1* | 10/2008 | Kim | H01L 22/32 257/48 |
| 2009/0174835 A1* | 7/2009 | Lee | G02F 1/1368 349/46 |
| 2011/0018571 A1* | 1/2011 | Kim | G02F 1/1345 324/760.02 |
| 2012/0056186 A1* | 3/2012 | Shirouzu | G02F 1/136204 257/59 |
| 2012/0188151 A1* | 7/2012 | Oh | G02F 1/133512 345/88 |
| 2012/0268396 A1* | 10/2012 | Kim | G06F 3/0412 345/173 |

FOREIGN PATENT DOCUMENTS

| | | |
|---|---|---|
| JP | 2003-241219 A | 8/2003 |
| JP | 2005-049519 A | 2/2005 |
| JP | 2007-025700 A | 2/2007 |
| JP | 2008-015368 A | 1/2008 |
| JP | 2008-129374 A | 6/2008 |
| JP | 2009-093023 A | 4/2009 |
| JP | 2010-102237 A | 5/2010 |
| JP | 2012-123475 A | 6/2012 |

* cited by examiner

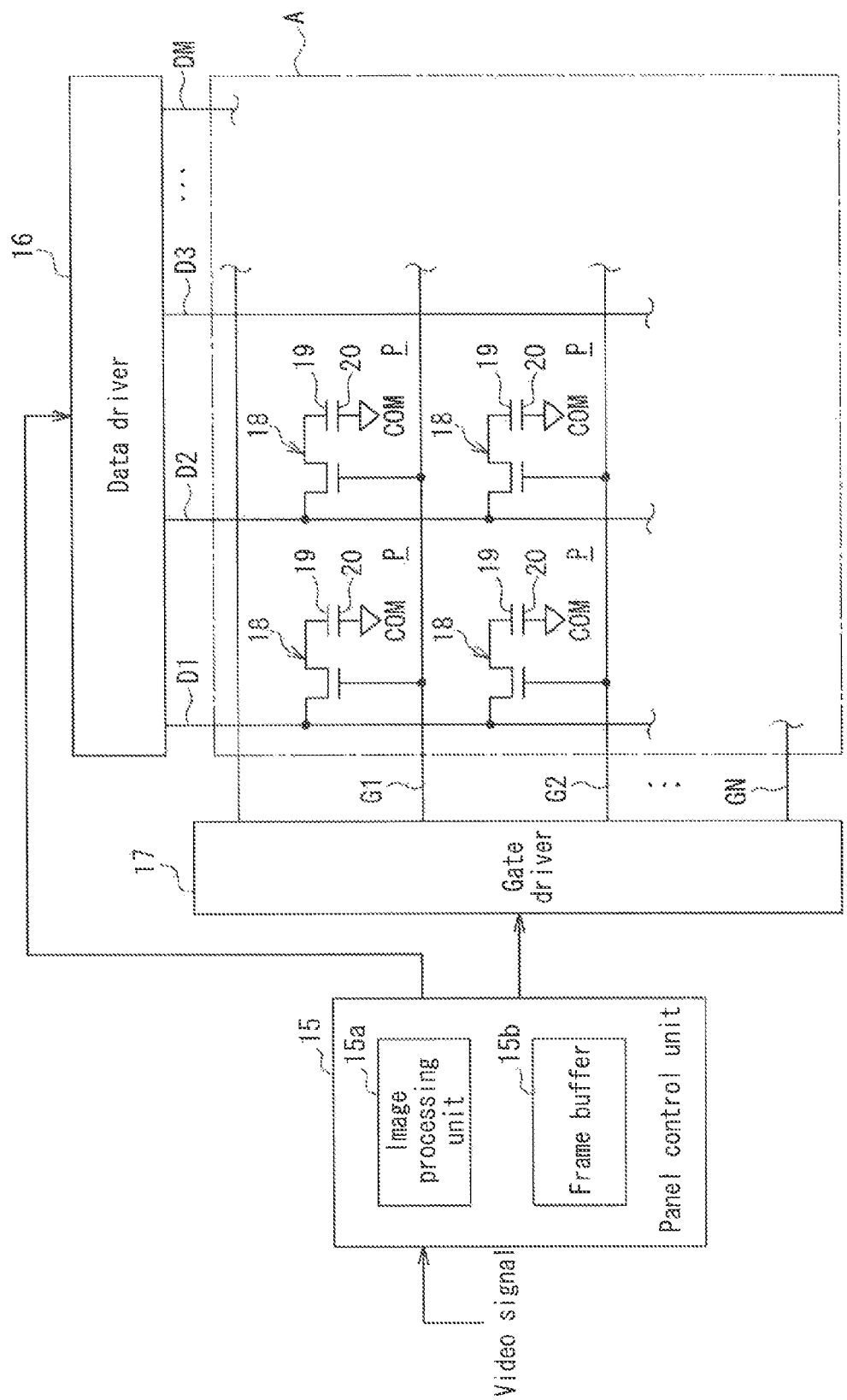
F I G. 2

ACTIVE MATRIX SUBSTRATE AND DISPLAY DEVICE USING SAME

TECHNICAL FIELD

The present invention relates to an active matrix substrate on which a plurality of data bus lines and a plurality of gate bus lines are arrayed in a matrix pattern, and to a display apparatus incorporating the same.

BACKGROUND ART

In recent years, for example, liquid crystal display apparatuses are widely used in liquid crystal televisions, monitors, mobile telephones, smartphones, and the like as flat panel displays that are advantageously thin and lightweight compared to conventional cathode ray tubes. In some known examples of such liquid crystal display apparatuses, a liquid crystal panel serving as a display panel incorporates an active matrix substrate on which a plurality of data bus lines (also referred to as signal wires or source wires) and a plurality of gate bus lines (also referred to as scan wires or gate wires) are arranged in a matrix pattern, and pixels are arranged in a matrix pattern as well. The pixels are in the vicinity of intersections between the data bus lines and the gate bus lines, and each pixel includes a switching element, such as a thin-film transistor (TFT), and a pixel electrode connected to the switching element.

For example, as described in the below-listed Patent Document 1, it has been suggested to provide a conventional active matrix substrate with switching elements for inspecting an active region of a liquid crystal display apparatus between connection pads (mounting terminals), which are connectable to a drive IC chip, and inspection wires, and with the drive IC chip in correspondence with a region where the inspection wires are installed.

Furthermore, as described in, for example, the below-listed Patent Document 2, another conventional active matrix substrate has been proposed on which an inspection circuit is arranged between a signal drive circuit and a drive IC in order to inspect a pixel array portion and the signal drive circuit for disconnection and the like.

PRIOR ART DOCUMENTS

Patent Documents

[Patent Document 1] JP 2008-15368A
[Patent Document 2] JP 2005-49519A

Disclosure of Invention

Problem to be Solved by the Invention

However, with the aforementioned conventional active matrix substrates, it is difficult to arrange wires and elements outside a display region while preserving their functions when a frame region (the region other than the display region) has been downsized or when the number of wires and elements has increased due to high definition.

For example, in the case of the active matrix substrate of Patent Document 1, there is a possibility that a sufficient space for installing inspection wires and the like cannot be secured when the number of connection pads (mounting terminals) has increased due to high definition or when a downsized driver is adopted in concert with a downsized frame of the active matrix substrate. In this case, necessary inspection elements, including inspection terminals and inspection wires, cannot be reliably installed. The space may be secured by, for example, reducing three inspection wires corresponding to R, G, and B down to one common wire. However, reducing inspection wires down to one no longer enables detection of a short circuit between neighboring bus lines, which results in the failure to preserve the functions of wires and elements outside a display region.

On the other hand, for example, on the active matrix substrate of Patent Document 2, an inspection circuit is arranged between a signal drive circuit and a drive IC inside a counter substrate, and hence it is not possible to detect defects, such as a short circuit and disconnection, of a fan-out portion of draw-out lines extending from the drive IC (driver) toward the inspection circuit (e.g., a portion in which the draw-out lines are arranged at an angle with respect to the direction of arrangement of data bus lines). In general, the interval between neighboring mounting terminals is smaller than the interval between neighboring data bus lines. Therefore, it is necessary to make the line width of draw-out lines formed in a fan-out portion smaller than the line width of the data bus lines, or to make the interval between such draw-out lines smaller than the interval between the data bus lines. As a result, a short circuit, disconnection, and the like easily occur. Especially, when a frame region has been downsized, a region for forming the draw-out lines is also downsized, which requires a further reduction in the line width and the interval. Consequently, a short circuit, disconnection, and the like easily occur. This gives rise to the problem that the functions of wires and elements outside a display region cannot be preserved.

In view of the aforementioned problem, the present invention aims to provide an active matrix substrate on which wires and elements outside a display region can be efficiently installed while preserving their functions, even when a frame region has been downsized or in the case of high definition, as well as a display apparatus incorporating such an active matrix substrate.

Means for Solving Problem

In order to achieve the aforementioned aim, an active matrix substrate of the present invention includes: a base member; a plurality of gate bus lines provided on the base member; a plurality of data bus lines provided in a layer different from a layer of the gate bus lines via an insulating film therebetween; a first switching element connected to the gate bus lines and the data bus lines; a mounting terminal for supplying a signal from a driver to the gate bus lines or the data bus lines; a plurality of draw-out lines connecting the mounting terminal and the gate bus lines or the data bus lines; a plurality of second switching elements that are each connected to a corresponding one of the plurality of draw-out lines; and a first common wire connected in common to at least two of the plurality of second switching elements. The draw-out lines include a fan-out portion that is arranged at an angle with respect to a direction of arrangement of the gate bus lines or the data bus lines. At least a portion of the first common wire and at least a portion of the second switching elements are arranged between the fan-out portion and the mounting terminal.

On the aforementioned active matrix substrate, at least a portion of the common wire and at least a portion of the second switching elements are arranged between the fan-out portion and the mounting terminal. In this way, a signal can be supplied to the fan-out portion and to the data bus lines or the gate bus lines via the first common wire and the second switching elements separately from a signal supplied from the mounting terminal, even when a frame region has been downsized or in the case of high definition. For example, in the manufacturing processes of the active matrix substrate, the draw-out lines formed in the fan-out portion can be inspected for a short circuit and disconnection, and voltage application processing for alignment control for liquid crystals can be performed. It is hence possible to provide an active matrix substrate on which wires and elements outside a display region can be efficiently installed while preserving their functions, even when a frame region has been downsized or in the case of high definition. It should be noted that the insulating film provided between the aforementioned gate bus lines and data bus lines is, for example, a gate insulating film covering the gate bus lines.

Furthermore, the aforementioned active matrix substrate may include: a third switching element connected to an end portion of the gate bus lines or the data bus lines to which the mounting terminal is not connected; and a second common wire connected in common to a plurality of third switching elements constituting the third switching element.

In this case, the third switching elements and the second common wire are provided in a section where the aforementioned mounting terminal is not provided. Therefore, the configurations at the mounting terminal side, such as the configuration of the aforementioned first common wire, can be simplified, and the second switching elements can be installed more easily even if a region for mounting the driver is small. Accordingly, the functions of wires and elements outside the display region can be preserved even when a region at the mounting terminal side has been further downsized or in the case of high definition.

Furthermore, on the aforementioned active matrix substrate, the second common wire may be constituted by a plurality of second common wires, and a predetermined number of the third switching elements may be connected to each of the plurality of second common wires.

In this case, operation processing, such as inspection processing and voltage application processing, can be performed per predetermined number of gate bus lines or data bus lines using the second common wires.

Furthermore, on the aforementioned active matrix substrate, the first common wire may be constituted by a plurality of first common wires, and a predetermined number of the second switching elements may be connected to each of the plurality of first common wires.

In this case, operation processing, such as inspection processing and voltage application processing, can be performed per predetermined number of gate bus lines or data bus lines using the first common wires.

Furthermore, on the aforementioned active matrix substrate, two of the second switching elements that are connected respectively to two neighboring draw-out lines among the draw-out lines may be arranged between the two neighboring draw-out lines and be connected while opposing each other via a common control wire.

In this case, the plurality of second switching elements can be efficiently installed while preserving their functions, even when a frame region has been downsized.

Furthermore, among the plurality of draw-out lines on the aforementioned active matrix substrate, one of two neighboring draw-out lines may be formed from the same conductive layer as the gate bus lines, whereas the other of the two neighboring draw-out lines may be formed from the same conductive layer as the data bus lines.

In this case, the interval between neighboring draw-out lines can be reduced, and a region necessary for forming the draw-out lines can be downsized. Moreover, the occurrence of a short circuit and disconnection of the draw-out lines can be inhibited. Therefore, the quality of the active matrix substrate can be kept high even when a frame region has been downsized.

Furthermore, on the aforementioned active matrix substrate, the first common wire may be constituted by a plurality of first common wires, two of the second switching elements that are connected respectively to two neighboring draw-out lines among the draw-out lines formed from the same conductive layer as the gate bus lines may each be connected to a different one of the first common wires, and two of the second switching elements that are connected respectively to the draw-out lines formed from the same conductive layer as the data bus lines may each be connected to a different one of the first common wires.

In this case, an inspection for disconnection and a short circuit can be carried out for each of draw-out lines that are in different conductive layers and neighbor each other, and for each of draw-out lines that are in the same conductive layer and neighbor each other. Therefore, the functions of wires and elements outside the display region can be preserved even when a frame region has been downsized.

Furthermore, the aforementioned active matrix substrate may include an interlayer insulating film provided so as to cover the first switching element, the interlayer insulating film having at least one layer; a pixel electrode connected to the first switching element; a common electrode that is made from transparent electrode material and is provided above or below the pixel electrode; and a metal electrode provided in a layer above or below the common electrode. At least a portion of the second switching elements may be covered by a light shielding film formed from the metal electrode.

In this case, as the switching elements are shielded from light, it is possible to prevent malfunction of the switching elements triggered by the generation of a leak current associated with the incidence of external light. Furthermore, in order to prevent malfunction of the second switching elements, the switching elements can be reliably shielded from light without being coated with resin or a tape with high light shielding properties or covered by a bezel.

Furthermore, on the aforementioned active matrix substrate, an oxide semiconductor may be used for both the first and second switching elements.

In this case, the performance of the switching elements can be further increased, the switching elements can be further downsized, and wires can be narrowed. Accordingly, wires and elements outside the display region can be installed while preserving their functions, even when a frame region has been downsized.

A display apparatus of the present invention incorporates any one of the aforementioned active matrix substrates.

The display apparatus constructed in the foregoing manner incorporates the active matrix substrate on which wires and elements outside a display region can be efficiently installed while preserving their functions, even when a frame region has been downsized. Accordingly, the display apparatus can be easily downsized while maintaining the quality.

Effects of the Invention

The present invention makes it possible to provide an active matrix substrate on which wires and elements outside a display region can be efficiently installed while preserving their functions, even when a frame region has been downsized or in the case of high definition, as well as a display apparatus incorporating such an active matrix substrate.

BRIEF DESCRIPTION OF DRAWINGS

FIG. 2 is a diagram for describing a configuration of a liquid crystal panel shown in FIG. 1.

DESCRIPTION OF THE INVENTION

Figure 1:
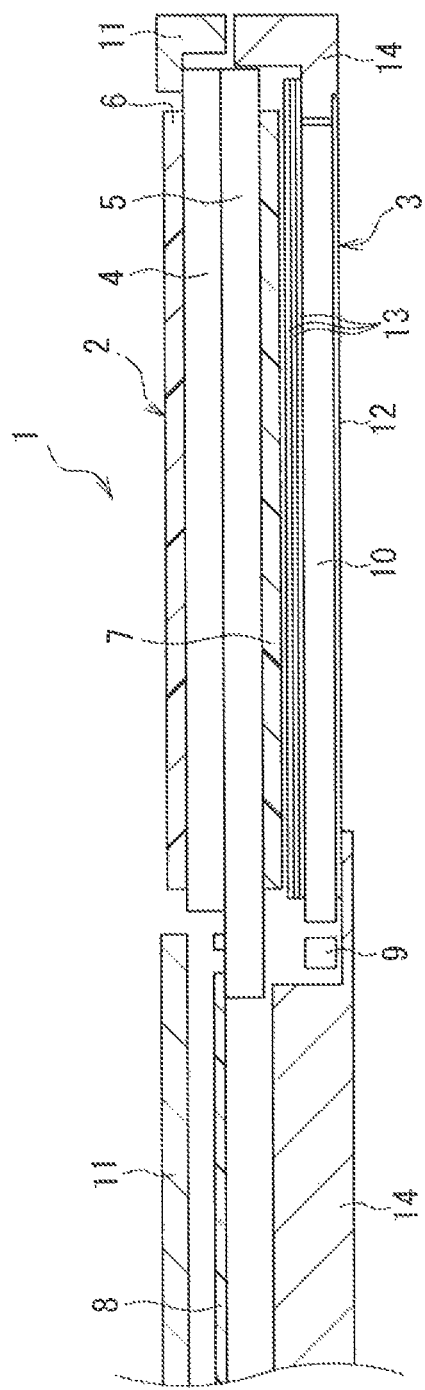
FIG. 1 is a diagram for describing a liquid crystal display apparatus according to a first embodiment of the present invention.

The following describes preferred embodiments of an active matrix substrate and a display apparatus of the present invention with reference to the drawings. It should be noted that the following description will be given using an example case in which the present invention is applied to a transmissive liquid crystal display apparatus. Furthermore, the dimensions of constituent elements in the drawings are not precise representations of the actual dimensions of the constituent elements, the actual dimensional ratios of the constituent elements, etc.

First Embodiment

Example Configuration of Liquid Crystal Display Apparatus

FIG. 1 is a diagram for describing a liquid crystal display apparatus incorporating an active matrix substrate according to a first embodiment of the present invention. In FIG. 1, a liquid crystal display apparatus 1 according to the present embodiment includes a liquid crystal panel 2 and a backlight apparatus 3. The liquid crystal panel 2 is arranged with an upper side thereof in FIG. 1 serving as a viewing side (a display surface side). The backlight apparatus 3 is arranged at a non-display surface side (a lower side in FIG. 1) of the liquid crystal panel 2, and produces illumination light for illuminating the liquid crystal panel 2.

The liquid crystal panel 2 includes a counter substrate 4 and an active matrix substrate 5 of the present invention, which constitute a pair of substrates, as well as polarizing plates 6 and 7 that are provided on the outer surfaces of the counter substrate 4 and the active matrix substrate 5, respectively. A later-described liquid crystal layer is held between the counter substrate 4 and the active matrix substrate 5. Planar, transparent glass material or transparent synthetic resin, such as acrylic resin, is used for the counter substrate 4 and the active matrix substrate 5. Resin films made from triacetyl cellulose (TAC), polyvinyl alcohol (PVA), or the like are used for the polarizing plates 6, 7. The polarizing plates 6, 7 are each attached to a corresponding one of the counter substrate 4 and the active matrix substrate 5 so as to cover at least an effective display region on a display surface of the liquid crystal panel 2. There are cases in which a λ/4 retarder (a quarter wave plate) is arranged between the polarizing plates 6, 7 and the liquid crystal layer.

The active matrix substrate 5 is one of the aforementioned pair of substrates. Pixel electrodes, thin-film transistors (TFTs), and the like are formed between the active matrix substrate 5 and the aforementioned liquid crystal layer in correspondence with a plurality of pixels included in the display surface of the liquid crystal panel 2 (the details will be described later). On the other hand, the counter substrate 4 is the other of the pair of substrates (counter substrate), and includes color filters, a counter electrode, and the like that are formed so as to oppose the aforementioned liquid crystal layer (not shown).

The liquid crystal panel 2 is also provided with a flexible printed circuit (FPC) 8 connected to a control apparatus (not shown) that performs drive control of the liquid crystal panel 2. By operating the aforementioned liquid crystal layer on a pixel-by-pixel basis, the display surface is driven on a pixel-by-pixel basis, thereby displaying a desired image on the display surface.

It should be noted that the liquid crystal panel 2 may have any liquid crystal mode and pixel structure. The liquid crystal panel 2 may also have any driving mode. That is to say, any liquid crystal panel capable of displaying information can be used as the liquid crystal panel 2. Therefore, a detailed configuration of the liquid crystal panel 2 is not shown in FIG. 1, and a description thereof is also omitted.

The backlight apparatus 3 includes a light emitting diode 9 serving as a light source, and a light guiding plate 10 that is arranged to oppose the light emitting diode 9. Furthermore, in the backlight apparatus 3, the light emitting diode 9 and the light guiding plate 10 are held by a bezel 14 having an L-shaped cross section, with the liquid crystal panel 2 arranged above the light guiding plate 10. A case 11 is mounted on the counter substrate 4. In this way, the backlight apparatus 3 is attached to the liquid crystal panel 2. They are integrated as the transmissive liquid crystal display apparatus 1 in which illumination light from the backlight apparatus 3 is incident on the liquid crystal panel 2.

Synthetic resin, such as transparent acrylic resin, is used for the light guiding plate 10, and light from the light emitting diode 9 enters the light guiding plate 10. A reflecting sheet 12 is arranged at a side of the light guiding plate 10 opposite from the liquid crystal panel 2 (counter surface side). Optical sheets 13, such as a lens sheet and a diffusion sheet, are provided at the liquid crystal panel 2 side (light emitting surface side) of the light guiding plate 10. Light from the light emitting diode 9 is guided inside the light guiding plate 10 in a predetermined light guiding direction (in FIG. 1, a direction from the left side to the right side), converted into the aforementioned illumination light that is planar and has uniform luminance, and then supplied to the liquid crystal panel 2.

Although the foregoing description has introduced a configuration with the edge-lit backlight apparatus 3 having the light guiding plate 10, the present embodiment is not limited in this way, and a direct-lit backlight apparatus may be used. It is also possible to use a backlight apparatus having the light source other than the light emitting diode, such as a cold cathode fluorescent tube and a hot cathode fluorescent tube.

Example Configuration of Liquid Crystal Panel 2

FIG. 2 is a diagram for describing a configuration of the liquid crystal panel shown in FIG. 1.

In FIG. 2, the liquid crystal display apparatus 1 (FIG. 1) is provided with a panel control unit 15 that performs drive control of the aforementioned liquid crystal panel 2 (FIG. 1) serving as a display unit for displaying information such as characters and images, as well as a data driver (source driver) 16 and a gate driver 17 that operate based on instruction signals from the panel control unit 15.

The panel control unit 15 is provided in the aforementioned control apparatus and receives, as input, a video signal from outside the liquid crystal display apparatus 1. The panel control unit 15 includes an image processing unit 15a that applies predetermined image processing to the input video signal and generates instruction signals to the data driver 16 and the gate driver 17, and a frame buffer 15b that can store display data corresponding to one frame included in the input video signal. The panel control unit 15 performs drive control of the data driver 16 and the gate driver 17 in accordance with the input video signal. As a result, information corresponding to the video signal is displayed on the liquid crystal panel 2.

The data driver 16 and the gate driver 17 are arranged on the active matrix substrate 5. Specifically, the data driver 16 is arranged on a surface of the active matrix substrate 5 so as to extend along the horizontal direction of the liquid crystal panel 2, which serves as a display panel, in a region outside an effective display region A of the liquid crystal panel 2. On the other hand, the gate driver 17 is arranged on the surface of the active matrix substrate 5 so as to extend along the vertical direction of the liquid crystal panel 2 in the region outside the aforementioned effective display region A. It should be noted that the gate driver 17 may be made up of two separate gate drivers that are provided with the effective display region A interposed therebetween, as will be described later in detail, or the gate driver 17 may be arranged so as to extend along the horizontal direction of the liquid crystal panel 2.

The data driver 16 and the gate driver 17 are drive circuits that drive a plurality of pixels P in the liquid crystal panel 2 on a pixel-by-pixel basis. The data driver 16 and the gate driver 17 are connected respectively to a plurality of data bus lines (source wires) D1 to DM (M is an integer equal to or larger than two, and hereinafter these lines are collectively referred to as "D") and a plurality of gate bus lines (gate wires) G1 to GN (N is an integer equal to or larger than two, and hereinafter these lines are collectively referred to as "G"). These data bus lines D and gate bus lines G are arrayed in a matrix pattern such that they intersect on a later-described base member that is included in the active matrix substrate 5 and is made from transparent glass material or transparent synthetic resin. That is to say, the data bus lines D are provided on the aforementioned base member in parallel to the column direction of the matrix (the vertical direction of the liquid crystal panel 2), whereas the gate bus lines G are provided on the aforementioned base member in parallel to the row direction of the matrix (the horizontal direction of the liquid crystal panel 2).

The aforementioned pixels P are provided in the vicinity of intersections between the data bus lines D and the gate bus lines G. Each pixel P includes a first thin-film transistor 18 serving as a first switching element, and a pixel electrode 19 connected to the first thin-film transistor 18. Each pixel P is structured such that a counter electrode 20 opposes the pixel electrode 19 with the aforementioned liquid crystal layer in the liquid crystal panel 2 interposed therebetween. That is to say, on the active matrix substrate 5, the first thin-film transistors 18 and the pixel electrodes 19 are provided in one-to-one relationship with the pixels.

Furthermore, on the active matrix substrate 5, regions of the plurality of pixels P are each formed in a corresponding one of regions that are defined by the data bus lines D and the gate bus lines G in a matrix pattern. The plurality of pixels P include red (R), green (G), and blue (B) pixels. The R, G, and B pixels are arranged sequentially in parallel to each of the gate bus lines G1 to GN in this order, for example. The R, G, and B pixels can display corresponding colors with a layer of the aforementioned color filters provided on the counter substrate 4.

On the active matrix substrate 5, based on an instruction signal from the image processing unit 15a, the gate driver 17 sequentially outputs scan signals (gate signals) to the gate bus lines G1 to GN for placing gate electrodes of the corresponding first thin-film transistors 18 in an on state. Based on an instruction signal from the image processing unit 15a, the data driver 16 outputs data signals (voltage signals (gradation voltages)) compliant with the luminance (gradation) of a display image to the corresponding data bus lines D1 to DM.

Example Configuration of Active Matrix Substrate

Figure 3:
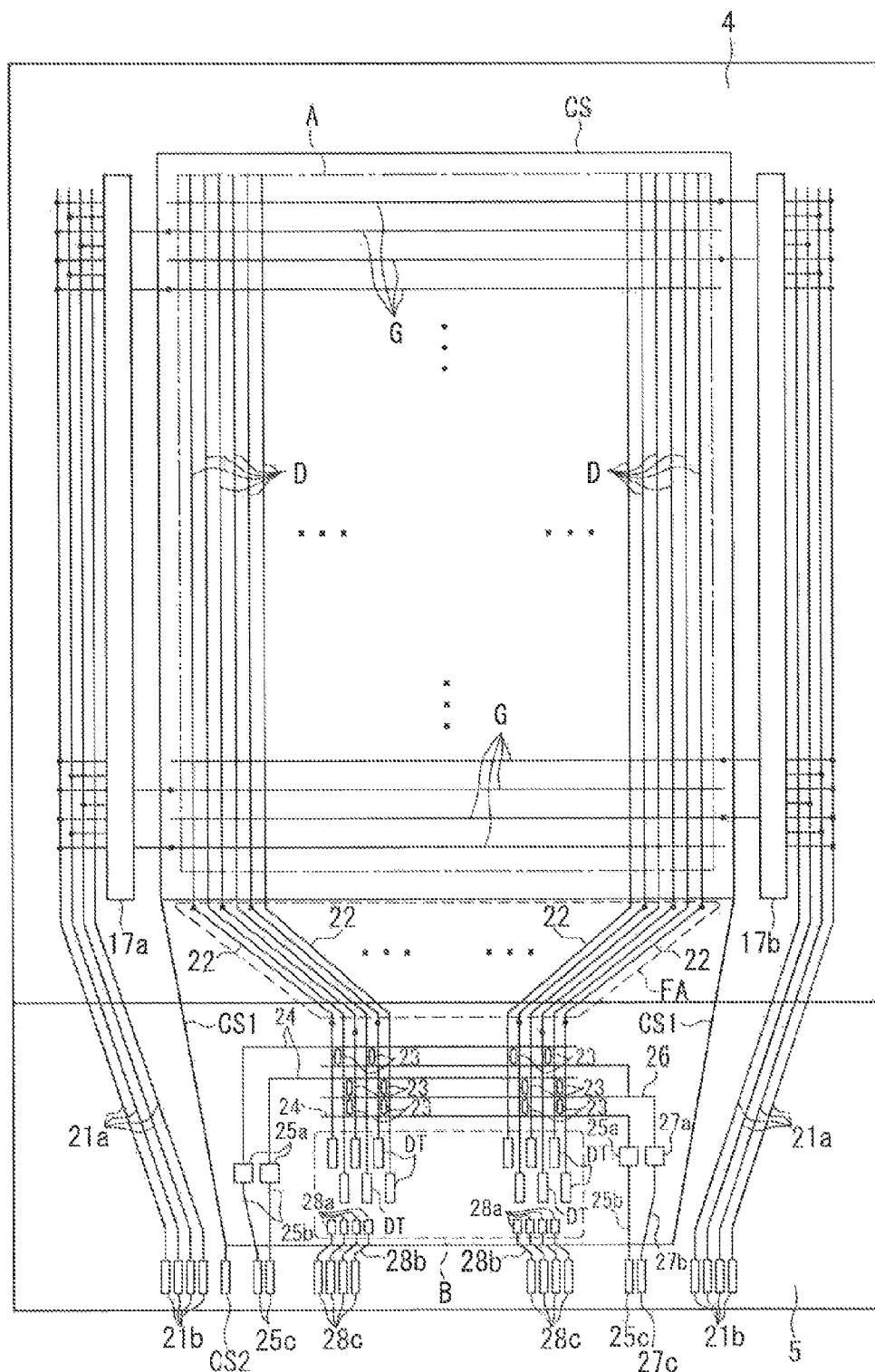
FIG. 3 is a diagram for describing main elements of an active matrix substrate shown in FIG. 1.
Figure 4:
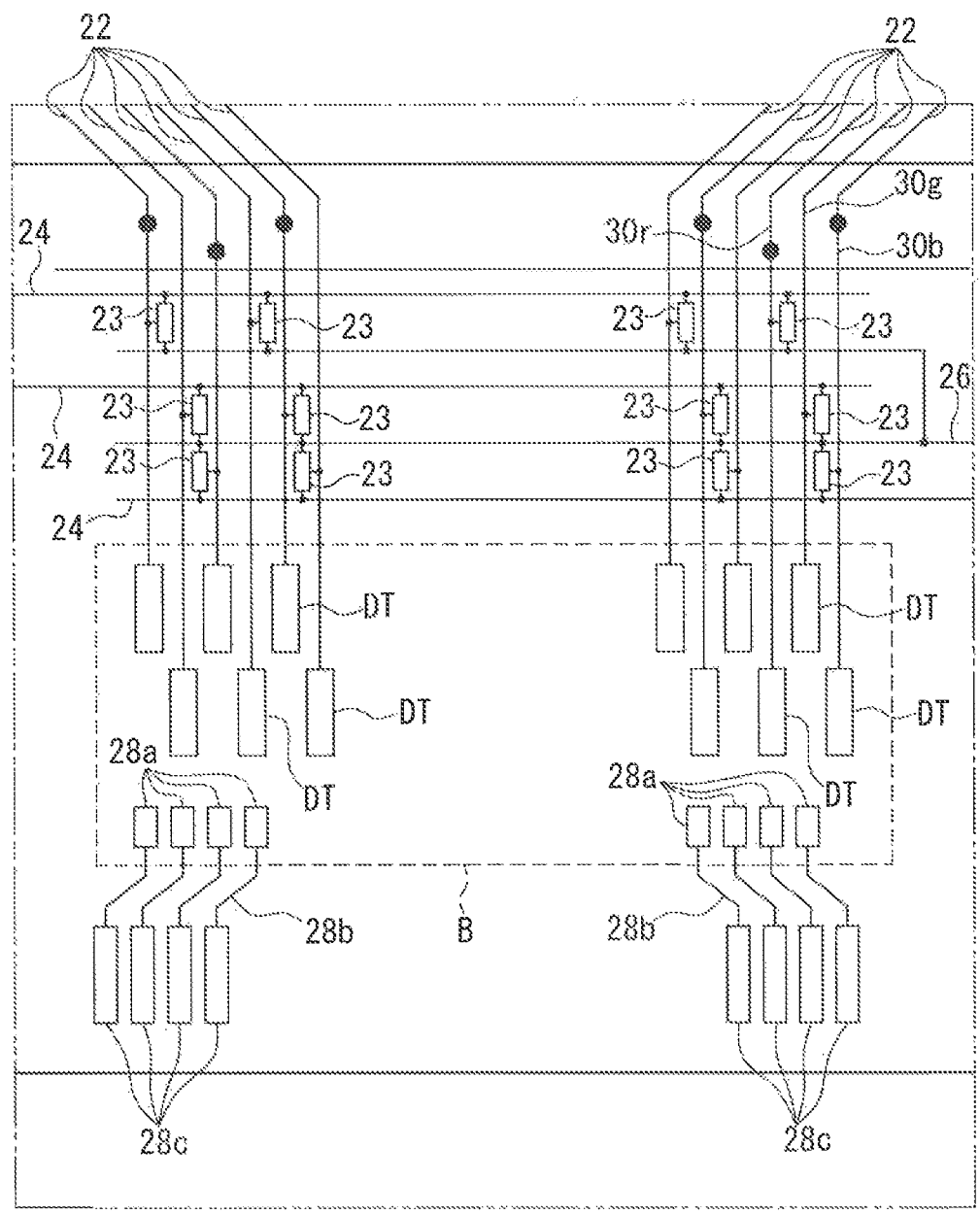
FIG. 4 is a diagram for describing the surroundings of a region for mounting a data driver.

FIG. 3 is a diagram for describing main elements of the active matrix substrate shown in FIG. 1. FIG. 4 is a diagram for describing the surroundings of a driver mounting region B (FIG. 3) on the aforementioned active matrix substrate 5.

As shown in FIG. 3, on the active matrix substrate 5, the plurality of data bus lines D and the plurality of gate bus lines G are arrayed in a matrix pattern in a portion covered by the counter substrate 4 (counter region). Furthermore, the aforementioned effective display region A is provided as indicated by a line with alternating long and short dashes in FIG. 3.

In the effective display region A, the plurality of gate bus lines G are formed in a gate layer, a gate insulating film (not shown) is provided so as to cover the gate bus lines G, and the plurality of data bus lines D are formed above the gate insulating film, i.e., in a source layer. In the present embodiment, the data bus lines D and the gate bus lines G are wires that are provided within the effective display region A.

Figure 17:
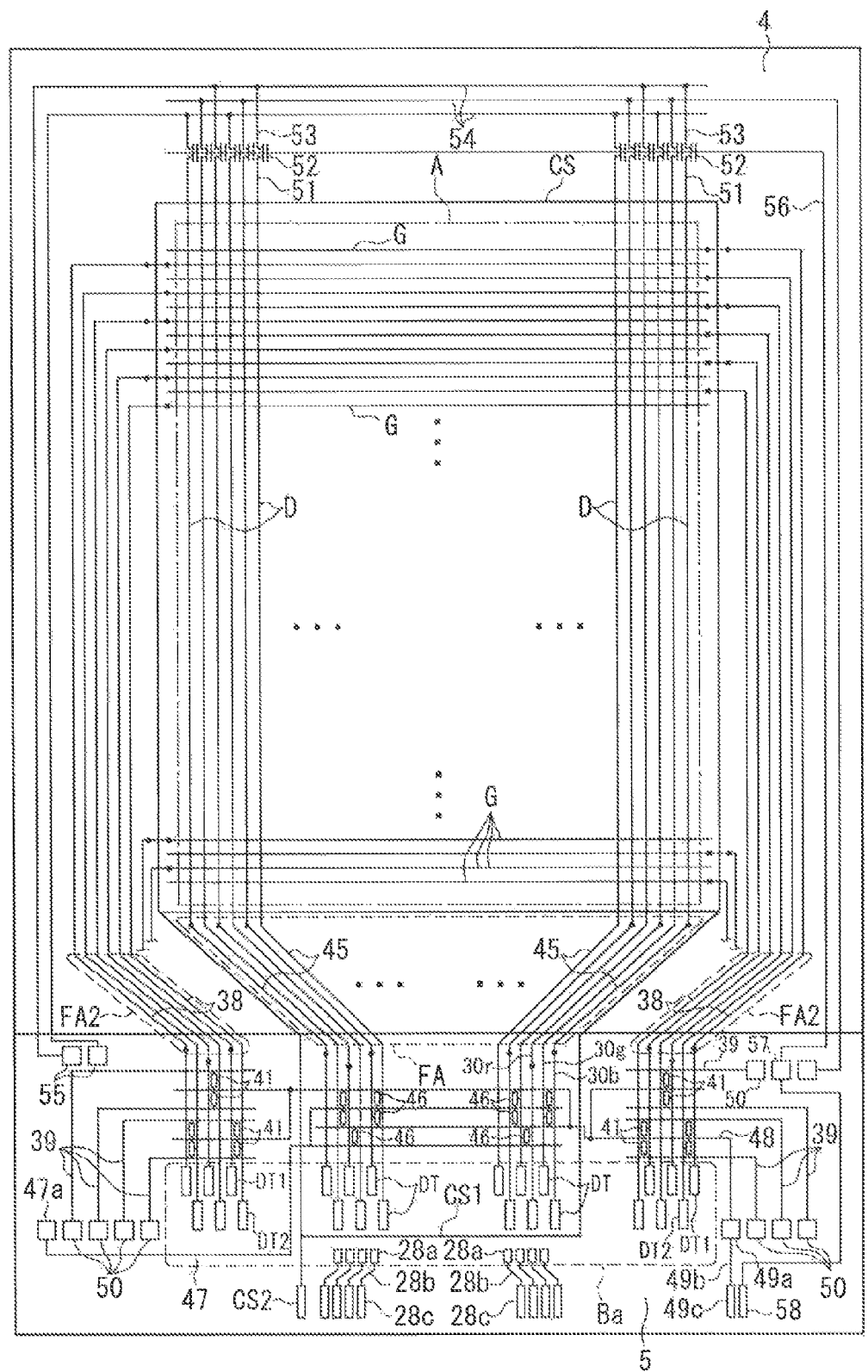
FIG. 17 is a diagram for describing main elements of an active matrix substrate according to a fifth embodiment of the present invention.

It should be noted that the points of connection between the bus lines formed in the source layer and the bus lines formed in the gate layer are indicated by black dots in FIG. 3. The positions of the gate bus lines G and the positions of the data bus lines D may be reversed. For example, the bus lines labeled G (the bus lines extending in the horizontal direction of the sheet) may be the data bus lines, and the bus lines labeled D (the bus lines extending in the vertical direction of the sheet) may be the gate bus lines. It should be noted that, in this configuration, a data driver composed of a driver chip (driver IC) is connected to the data bus lines labeled G (the bus lines extending in the horizontal direction of the sheet) as shown in FIG. 17, which will be described later.

On the active matrix substrate 5, the counter region includes the effective display region A, and a portion that is not covered by the counter substrate 4 (non-counter region) includes the driver mounting region B and mounting terminals for various types of signals.

Terminals for inputting signals to wires in the effective display region A are provided outside the effective display region A on at least one of side sections surrounding the effective display region A. In the example of FIG. 3, a plurality of mounting terminals are arranged in a section where the driver mounting region B is located. Draw-out lines connected to the mounting terminals are connected to wires within the effective display region A beside one of the edges of the effective display region A. In the present embodiment, wires that are connected to the data bus lines D or the gate bus lines G inside the effective display region A and are installed inside the effective display region A are assumed as data bus line draw-out lines or gate bus line draw-out lines.

Outside the effective display region A, data bus line draw-out lines 22 are connected to the data bus lines D. Data signals (voltages) for driving the corresponding pixels are input (applied) to the data bus lines D via the data bus line draw-out lines 22.

The data bus line draw-out lines 22 include a fan-out portion FA that is drawn out from a section where the plurality of mounting terminals are provided toward a section where the plurality of data bus lines D are provided. For example, in FIG. 3, the fan-out portion FA according to the present embodiment is a portion in which the plurality of draw-out lines connecting the data bus lines D and the mounting terminals are arranged at an angle with respect to the direction of arrangement of the data bus lines D (i.e., the direction in which the data bus lines D extend). It should be noted that the plurality of draw-out lines in the fan-out portion FA may be arranged in such a manner that the interval therebetween increases toward the data bus lines D, or may be arranged in parallel to one another. In terms of shape, the draw-out lines in the fan-out portion FA are not limited to being linear, and may be, for example, curved or bent.

Outside the effective display region A, approximately half of the data bus lines D formed in the source layer are cross-connected to the data bus line draw-out lines 22 formed in the gate layer. The data bus line draw-out lines 22 in the gate layer are cross-connected from the gate layer to the source layer in the vicinity of the boundary between the counter region and the non-counter region. For example, as shown in FIG. 3, the data bus line draw-out lines 22 in the gate layer are cross-connected from the gate layer to the source layer outside the counter region. In this way, the data bus line draw-out lines 22 are connected to mounting terminals DT in the state where all of them are formed in the source layer.

In the example of FIG. 3, among the data bus line draw-out lines 22 in the fan-out portion FA, neighboring lines are formed in different layers. Specifically, the plurality of data bus line draw-out lines 22 are arranged in such a manner that a line formed in the source layer and a line formed in the gate layer alternate. In this way, a region occupied by the data bus line draw-out lines 22 in the fan-out portion FA can be downsized.

On the other hand, the driver mounting region B according to the present embodiment is a region for mounting the data driver 16 shown in FIG. 2. The data driver 16 is connected to FPC connection terminals 28c of the FPC (not shown) via wires 28b, and an instruction signal from the image processing unit 15a is input to the data driver 16 via the FPC. It should be noted that the gate driver 17 shown in FIG. 2 may be mounted in the driver mounting region B. Furthermore, instead of a driver itself, an FPC substrate equipped with a driver may be connected to the driver mounting region B. In this case, the FPC connection terminals 28c, FPC terminal draw-out lines 28b, and driver driving input terminals 28a are unnecessary.

On the base member (not shown) of the active matrix substrate 5, gate drivers 17a, 17b are monolithically formed with the effective display region A interposed therebetween. The plurality of gate bus lines G are connected alternately to the gate drivers 17a, 17b. That is to say, among the plurality of gate bus lines G, a gate bus line G that is connected to the gate driver 17a only at its left end portion and a gate bus line G that is connected to the gate driver 17b only at its right end portion alternate. In this case, regions of the gate drivers 17a, 17b can be downsized. Therefore, the foregoing configuration is suitable for a smartphone, a mobile game device, and the like that have relatively small screens.

It should be noted that all of the plurality of gate bus lines G may be connected to the gate driver 17a at their left end portions, and to the gate driver 17b at their right end portions. In this case, defective display caused by a delay in the gate signals (flickering) can be reduced. Therefore, the foregoing configuration is suitable for a tablet PC, a notebook PC, a television, and the like that have relatively large screens.

The gate drivers 17a, 17b are connected to FPC connection terminals 21b of the FPC via corresponding wires 21a, and an instruction signal from the image processing unit 15a (FIG. 2) is input to the gate drivers 17a, 17b via the FPC. It should be noted that a gate driver 17 may be provided only at one side of the effective display region A. Furthermore, the gate drivers 17a, 17b may be composed of an IC chip and mounted on the base member.

On the aforementioned base member of the active matrix substrate 5, an auxiliary capacitance electrode CS is provided to generate a predetermined auxiliary capacitance for each of the pixels P. The auxiliary capacitance electrode CS is connected to an auxiliary capacitance electrode driving signal terminal CS2 via auxiliary capacitance electrode driving signal wires CS1. The FPC connection terminals of the aforementioned FPC 8 are connected to the auxiliary capacitance electrode driving signal terminal CS2, and voltage is supplied to the auxiliary capacitance electrode CS. The auxiliary capacitance electrode CS constitutes a common electrode, is made from transparent electrode material, and is provided below the pixel electrodes 19.

As shown in FIG. 4, on the active matrix substrate 5 according to the present embodiment, first common wires 24 are provided, for example, in one-to-one relationship with the colors R, G, B so as to extend in a direction orthogonal to the data bus line draw-out lines 22. With use of the first common wires 24, it is possible to inspect the connected data bus lines D and data bus line draw-out lines 22 for disconnection and a short circuit, take countermeasures against static electricity, and the like in the manufacturing processes of the active matrix substrate 5.

Each first common wire 24 is connected to a predetermined number of data bus line draw-out lines 22 of a corresponding color R, G, or B via second thin-film transistors 23 serving as second switching elements. Signal terminals 25a (FIG. 3) for inputting, for example, an inspection signal are connected in one-to-one relationship to the first common wires 24. An inspection signal associated with inspection processing and voltage associated with voltage application processing for each of the plurality of data bus lines D are input from the corresponding terminal 25a or input terminal 25c. In the liquid crystal display apparatus 1 as a final product, the input terminals 25c can be earthed via the aforementioned FPC 8.

The second thin-film transistors 23 are examples of switching elements that control connection among the data bus lines D, the data bus line draw-out lines 22, and the first common wires 24. The second thin-film transistors 23 can switch between on/off of signal input from the signal terminals 25a to the data bus line draw-out lines 22. In order to perform control for switching between on/off, a control line 26 for inputting control signals to the second thin-film transistors 23 and a control signal terminal 27a (FIG. 3) connected to the control line 26 are provided.

The second thin-film transistors 23, the first common wires 24, the control line 26, and the like are used in predetermined operation processing, e.g., inspection processing and countermeasures against static electricity with respect to each of the plurality of data bus lines D, or voltage application processing performed in alignment processing for liquid crystal molecules in the aforementioned liquid crystal layer. In this way, signals can be input through a channel different from a channel for driver signals from the mounting terminals DT.

The data driver 16 is mounted on the active matrix substrate 5 in the driver mounting region B. That is to say, the mounting terminals DT are connected to output electrodes (bumps, not shown) of the data driver 16, and an instruction signal (driving signal) is output to each data bus line D. Input electrodes (not shown) of the data driver 16 are connected to the driver driving input terminals 28a. An instruction signal from the image processing unit 15a (FIG. 2) is input to the data driver 16 via the FPC connection terminals 28c of the FPC, the FPC terminal draw-out lines 28b, and the driver driving input terminals 28a.

In the present example, as shown in FIG. 3, the second thin-film transistors 23 that can be used in a lighting inspection are provided at an upper side (an upper side on the sheet of FIG. 3) relative to the driver mounting region B, and elements for the inspection are not arranged at left, right, and lower sides relative to the driver mounting region B. Therefore, a region for installing common electrode signal lines can be enlarged. Accordingly, the horizontal width of the common electrode signal lines can be increased, and the wire resistance thereof can be kept low. By reducing the resistance of the common electrode signal lines, a delay in signals input to the common electrode (common signals or counter signals) can be inhibited, and defective display, such as shadowing, can be reduced.

Example Configurations of Surroundings of Pixels

Figure 5:
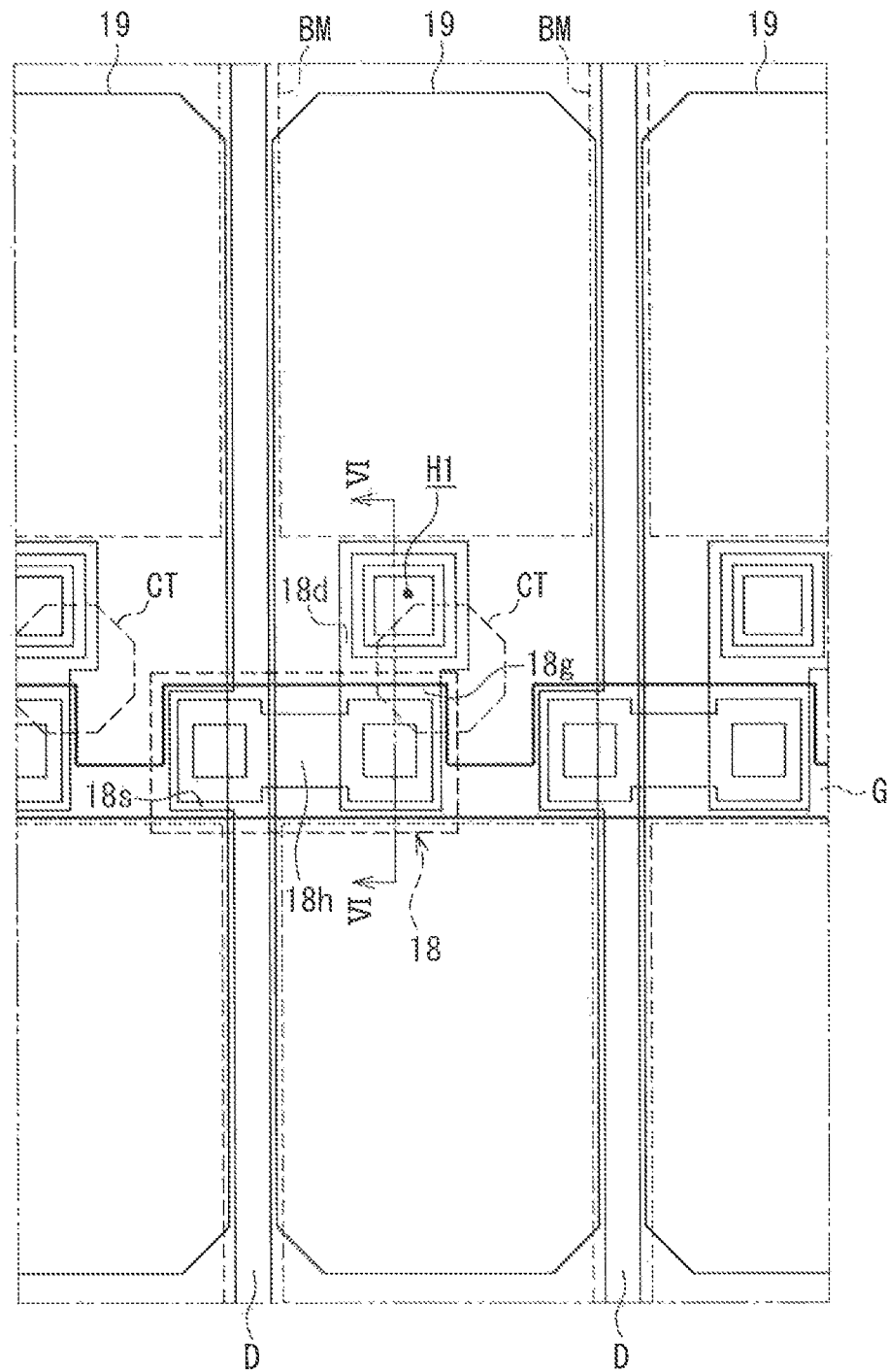
FIG. 5 is a diagram for describing configurations of the surroundings of pixels.
Figure 6:
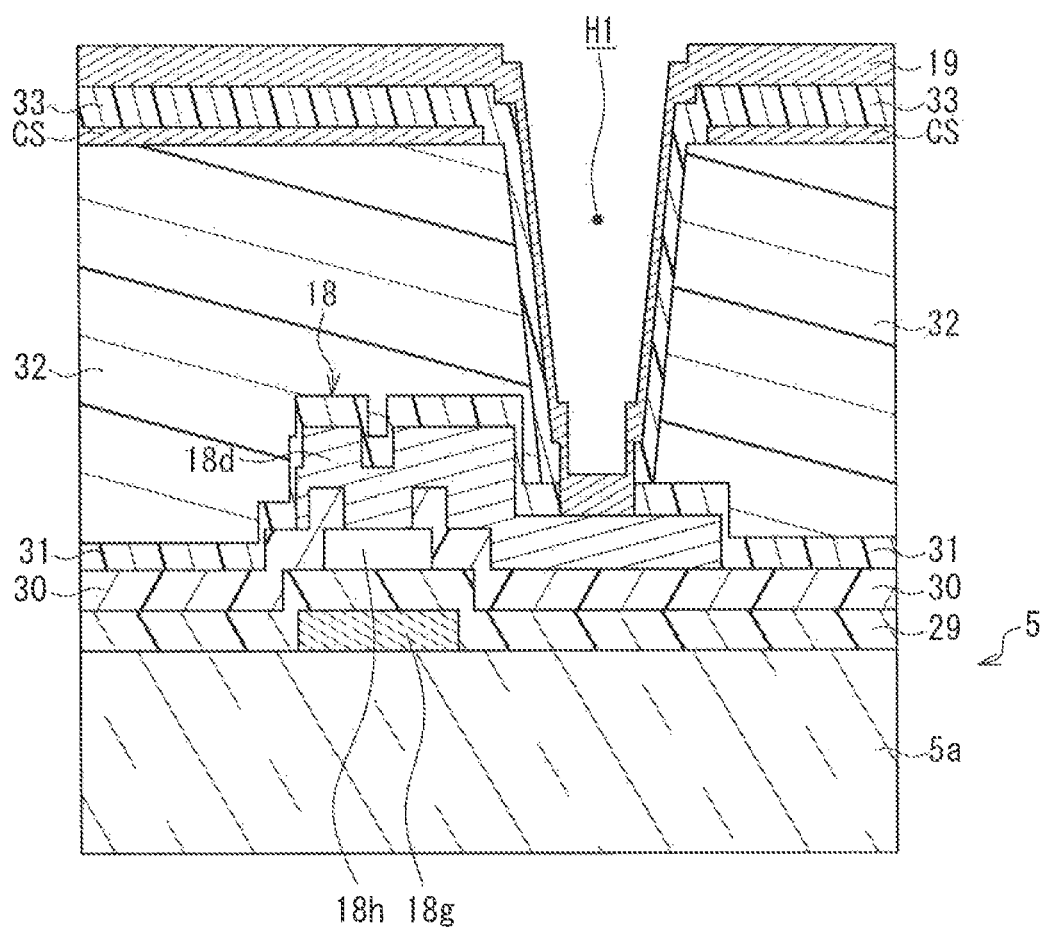
FIG. 6 is a cross-sectional view taken along the line VI-VI of FIG. 5.

FIG. 5 is a diagram for describing configurations of the surroundings of the pixels on the aforementioned active matrix substrate. FIG. 6 is a cross-sectional view taken along the line VI-VI of FIG. 5. The pixels can operate in, for example, a homeotropic alignment mode called a continuous pinwheel alignment (CPA) mode.

As shown in FIG. 5, each pixel is structured in a region defined by the gate bus line G and the data bus line D intersecting at right angles, and in each pixel, the first thin-film transistor 18 (an example of the first switching element) is formed in the vicinity of a portion on the gate bus line G. Specifically, as shown in FIGS. 5 and 6, each first thin-film transistor 18 includes a gate electrode 18g extended from the gate bus line G, a gate insulating film 29 formed on the gate electrode 18g, a semiconductor layer 18h and a channel protection layer 30 formed on the gate insulating film 29, a drain electrode 18d formed on the semiconductor layer 18h and the channel protection layer 30, an interlayer insulating film 31 formed on the drain electrode 18d, and a source electrode 18s extended from the data bus line D.

Layered metal films forming a multi-layer structure are used for the gate bus lines G and the gate electrodes 18g. Examples thereof include metal films forming a two-layer structure—e.g., layers of a copper film and a titanium film, layers of a copper film and a molybdenum film, and layers of a copper film and a molybdenum alloy film—or metal films forming a three-layer structure—e.g., layers of an aluminum film, a titanium film, and an aluminum film, and layers of a molybdenum film, an aluminum film, and a molybdenum film. There are cases in which a molybdenum film, an aluminum film, a chromium film, or a film of an alloy thereof is used as a single layer.

For example, silicon nitride (SiNx) or layered films of silicon nitride (SiNx) and silicon oxide ($SiO_2$) are used for the gate insulating film 29.

For example, an oxide semiconductor is used for the semiconductor layers 18h. An In—Ga—Zn—O-based, amorphous oxide semiconductor containing In, Ga, and Zn at a ratio of 1:1:1 is favorably used as the oxide semiconductor. It should be noted that the ratio of In, G, and Zn is not limited to the aforementioned ratio, and any appropriate ratio may be chosen. Other oxide semiconductor films may be used in place of the In—Ga—Zn—O-based oxide semiconductor film.

For example, the semiconductor layers 18h may be formed from a film of $InGaO_3$ (ZnO), magnesium zinc oxide ($Mg_xZn_{1-x}O$), cadmium zinc oxide ($Cd_xZn_{1-x}O$), cadmium oxide (CdO), or the like. The semiconductor layers 18h may be formed using ZnO doped with one or more types of impurity elements selected from the chemical elements in group 1, group 13, group 14, group 15, or group 17. ZnO may not be doped with impurity elements. ZnO may be in an amorphous state, a polycrystalline state, or a microcrystalline state where the amorphous state and the polycrystalline state coexist.

The amorphous, In—Ga—Zn—O-based oxide semiconductor is advantageous in that it can be manufactured at low temperature and it can achieve high mobility. It should be noted that a crystalline, In—Ga—Zn—O-based oxide semiconductor may be used in place of the amorphous, In—Ga—Zn—O-based oxide semiconductor. It is preferable that the c-axis of the crystalline, In—Ga—Zn—O-based oxide semiconductor layer be substantially perpendicular to a layer surface. A thin-film transistor having such an In—Ga—Zn—O-based oxide semiconductor layer is described in, for example, JP 2012-123475A.

In addition to the foregoing description, the semiconductor layers 18h may be constructed using, for example, amorphous silicon, polysilicon, or microcrystalline silicon.

For example, silicon oxide ($SiO_2$) is used for the channel protection layer 30. It should be noted that the channel protection layer 30 is not an essential element, and the installation thereof may be omitted. For example, metal films forming a two-layer structure—e.g., layers of a copper film and a titanium film, layers of a copper film and a molybdenum film, and layers of a copper film and a molybdenum alloy film—or metal films forming a three-layer structure—e.g., layers of an aluminum film, a titanium film, and an aluminum film, and layers of a molybdenum film, an aluminum film, and a molybdenum film—are used for the data bus lines D, the source electrodes 18s, and the drain electrodes 18d. There are cases in which a molybdenum film, a chromium film, or a film of an alloy thereof is used as a single layer.

As shown in FIG. 6, an interlayer insulating film 32 is formed so as to cover the first thin-film transistors 18, and additionally, the auxiliary capacitance electrode CS, an interlayer insulating film 33, and the pixel electrodes 19 are sequentially layered on the interlayer insulating film 32.

For example, silicon nitride (SiNx) is used for the interlayer insulating film 31. On the other hand, for example, a photosensitive organic film is used for the interlayer insulating film 32. For example, transparent electrode material, such as ITO and IZO, is used for the auxiliary capacitance electrode CS. For example, silicon nitride (SiNx) is used for the interlayer insulating film 33. The auxiliary capacitance electrode CS and the later-described pixel electrodes 19 are layered together via the interlayer insulating film 33, thereby forming an auxiliary capacitance on a per-pixel P basis. The pixel electrodes 19 are formed on the interlayer insulating film 33. For example, transparent electrode material, such as ITO and IZO, is used for the pixel electrodes 19.

As shown in FIG. 5, black matrix films BM are provided so as to cover the data bus lines D, the gate bus lines G, and the first thin-film transistors 18, and an opening is formed on the pixel electrode 19 in each pixel P. The black matrix films BM are provided for the purpose of taking countermeasures against color mixture in the case where the active matrix substrate 5 and the counter substrate 4 are attached in a misaligned manner, shielding channel portions of the first thin-film transistors 18 from light, or taking countermeasures against a decrease in the display quality caused by alignment disorder of liquid crystals at contact holes H1.

As shown in FIG. 6, the contact holes H1 are formed in the interlayer insulating film 32. In this way, the pixel electrodes 19 are electrically connected to the drain electrodes 18d via the contact holes H1.

In the present example, operations are performed in the homeotropic alignment mode called the CPA mode, and therefore liquid crystals with negative dielectric constant anisotropy (e.g., nematic liquid crystals) are held between the active matrix substrate 5 and the counter substrate 4 (not shown). As shown in FIG. 5, in order to uniformly control the alignments of liquid crystals with high responsiveness, alignment control protrusions CT are formed between the aforementioned counter electrode 20 and a homeotropic alignment film. The alignment control protrusions CT are formed from, for example, acrylic resin so as to have an octagonal shape in a plan view. It should be noted that the alignment control protrusions CT are not limited to having an octagonal shape and may have, for example, a circular shape or a hexagonal shape in a plan view. In addition to the foregoing description, cutouts may be provided in the counter electrode 20 in one-to-one relationship with the pixels P as objects for alignment control in place of the alignment control protrusions CT.

For example, with regard to the pixels P of the CPA mode, the aforementioned alignment control protrusion CT is positioned in a substantially central portion of each pixel P, and within one pixel, liquid crystals centering around the aforementioned alignment control protrusion CT continuously vary in terms of the alignment direction. That is to say, as the alignment control protrusion CT is provided in the substantially central portion of each pixel P, liquid crystal molecules in the liquid crystal layer are radially aligned around the alignment control protrusion CT, i.e., the central portion of the pixel, at the time of voltage application. By thus using the alignment control protrusions CT, the liquid crystal molecules in the pixels P can be radially aligned at the time of voltage application, and hence viewing angle properties can be improved.

The polymer sustained alignment (PSA) technology is incorporated in the pixels P according to the present embodiment. The PSA technology is intended to form an alignment sustaining layer for pretilting liquid crystals in the absence of voltage so as to restrict the alignment direction of liquid crystal molecules in the absence of voltage. The alignment sustaining layer is formed as a polymer layer by, after forming a liquid crystal cell, photopolymerizing a photopolymerizable monomer (or oligomer) that has been mixed with liquid crystal material in advance, typically in the state where voltage is applied to the liquid crystal layer. The alignment sustaining layer enables liquid crystals to, in the absence of voltage, sustain (remember) the alignment orientations and pretilt angles that are slightly tilted (by, for example, 2° to 3°) with respect to a direction perpendicular to a substrate surface of the active matrix substrate 5. As a result, a response speed related to the liquid crystal alignments at the time of voltage application can be improved. Furthermore, when a surface of the liquid crystal panel 2 has been pressed by a finger, the speed of alignment restoration can be accelerated. That is to say, by incorporating the PSA technology for the pixels P of the CPA mode, the response speed and the speed of restoration following the finger pressing can be advantageously improved.

Voltage application for implementing the PSA technology can be performed using the aforementioned terminals 25a or the aforementioned input terminals 25c. For example, voltage is supplied to all of the data bus lines D via (the input terminals 25c, wires 25b,) the terminals 25a, the first common wires 24, connection wires 35, the second thin-film transistors 23, the aforementioned mounting terminals, and the data bus line draw-out lines 22. Furthermore, the gate drivers 17a, 17b are driven by inputting a predetermined signal to gate driver driving signal terminals 21b, and voltage for turning on the first thin-film transistors 18 is supplied to the gate bus lines G. As a result, voltage supplied to the aforementioned data bus lines D is supplied to the liquid crystal layer via the first thin-film transistors 18, and the alignment sustaining layer is formed.

Example Configurations of Main Elements of Active Matrix Substrate 5

Figure 7:
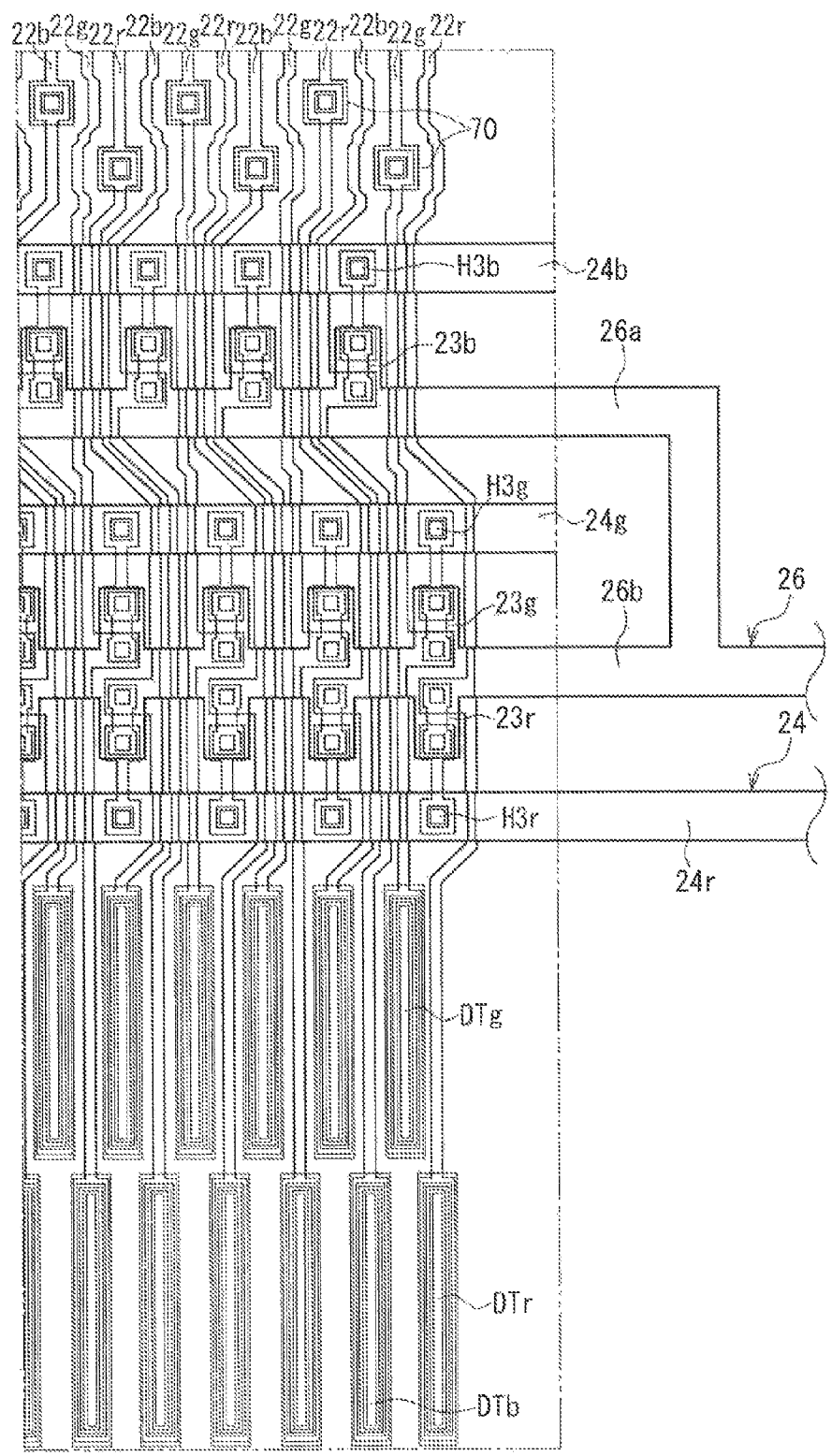
FIG. 7 is a diagram for describing configurations of main elements of the aforementioned active matrix substrate.

FIG. 7 is a diagram for describing configurations of main elements of the aforementioned active matrix substrate. FIG.

Figure 9:
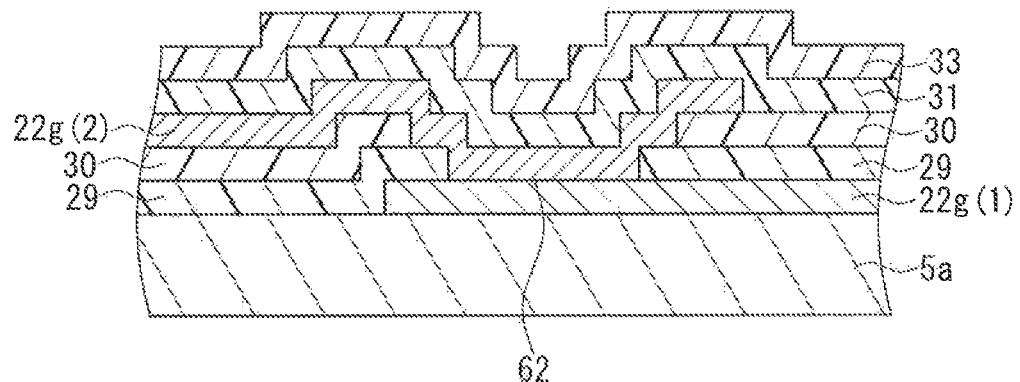
FIG. 9 is a cross-sectional view taken along the line IX-IX of FIG. 8.
Figure 10:
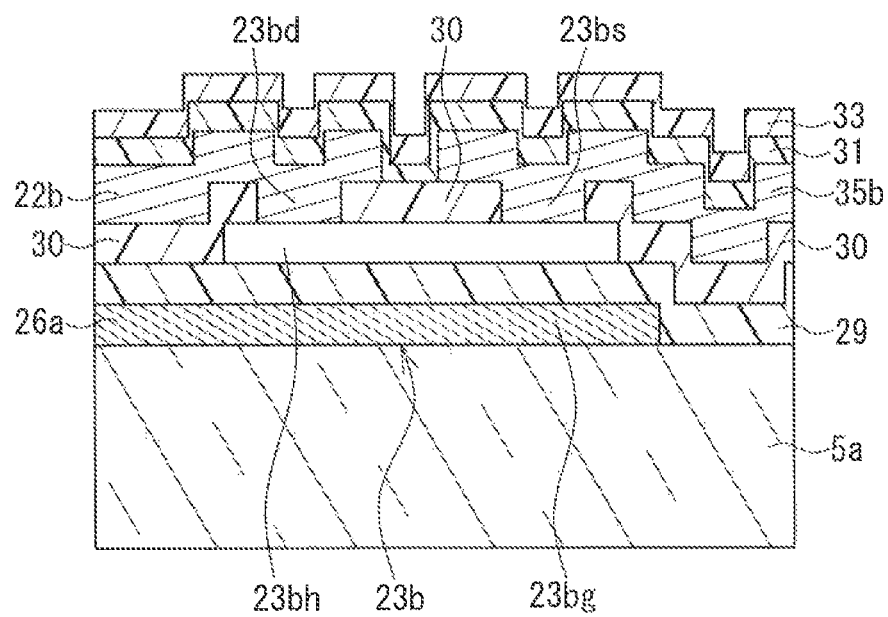
FIG. 10 is a cross-sectional view taken along the line X-X of FIG. 8.

8 is an enlarged view of configurations of main elements of the active matrix substrate shown in FIG. 7. FIG. 9 is a cross-sectional view taken along the line IX-IX of FIG. 8. FIG. 10 is a cross-sectional view taken along the line X-X of FIG. 8.

Figure 8:
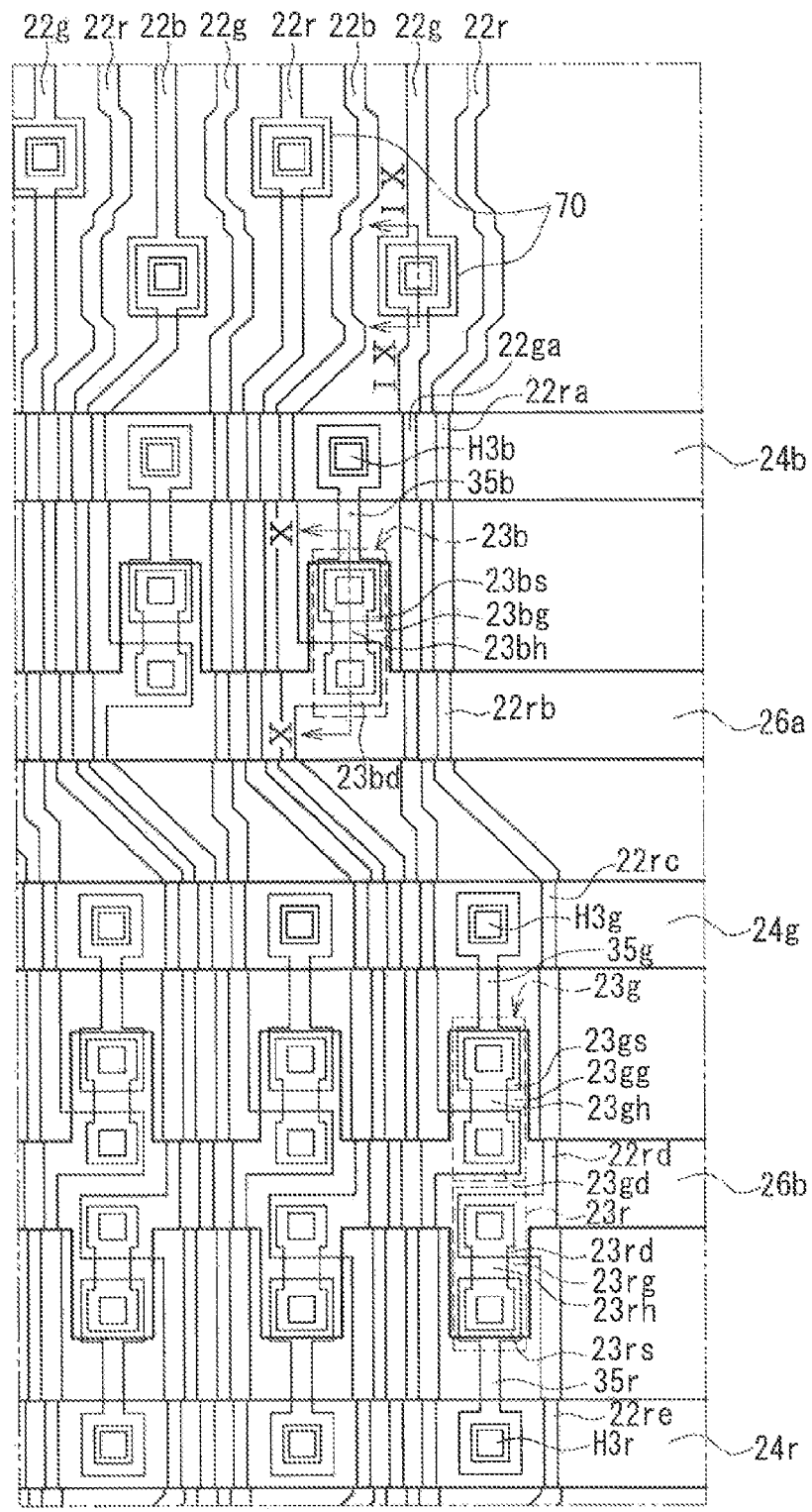
FIG. 8 is an enlarged view of configurations of main elements of the active matrix substrate shown in FIG. 7.

As shown in FIGS. 7 and 8, on the active matrix substrate 5 according to the present embodiment, data bus line draw-out lines 22r, 22g, and 22b that correspond respectively to, for example, the colors R, G, and B are sequentially arrayed along the left-right direction of the figures.

The data bus line draw-out lines 22r, 22g, and 22b are connected respectively to mounting terminals DTr, DTg, and DTb. As shown in FIG. 7, the mounting terminals DTr, DTg, DTb are staggered in two rows in such a manner that each mounting terminal DT is positionally shifted relative to another neighboring mounting terminal DT. In this way, the plurality of mounting terminals DT can be efficiently installed, and the chance of the occurrence of a short circuit in the vicinity of two adjacent mounting terminals DT can be lowered.

In FIGS. 7 and 8, among the plurality of data bus line draw-out lines 22r, 22g, 22b that are continuous with the fan-out portion FA, one of two neighboring data bus line draw-out lines 22 is formed from the same conductive layer as the gate bus lines G, whereas the other of the two neighboring data bus line draw-out lines 22 is formed from the same conductive layer as the data bus lines D. Specifically, at an upper side (an upper side of the sheet) relative to cross-connection portions 70, one of two neighboring data bus line draw-out lines 22 is formed in the gate layer (first conductive layer) on the base member 5a (FIG. 6), whereas the other of the two neighboring data bus line draw-out lines 22 is formed in the source layer (second conductive layer) on the gate insulating film that covers the gate layer.

The aforementioned gate layer can be formed on the base member 5a (FIG. 6) using the same metal material as the gate electrodes 18g shown in FIG. 6 (a plurality of types of metal material having a single-layer or layered structure), through the same manufacturing processes as the gate electrodes 18g shown in FIG. 6. On the other hand, the aforementioned source layer can be formed above the base member 5a using the same metal material as the source electrodes 18s and the drain electrodes 18d shown in FIG. 6 (a plurality of types of metal material having a single-layer or layered structure), through the same manufacturing processes as the source electrodes 18s and the drain electrodes 18d shown in FIG. 6.

On the active matrix substrate 5, the data bus line draw-out lines 22r, 22g, 22b formed in the gate layer (the same conductive layer as the gate bus lines G) are cross-connected from the gate layer to the source layer (the same conductive layer as the data bus lines D) at the cross-connection portions 70. The cross-connection portions 70 are arranged between the fan-out portion FA and the second thin-film transistors 23.

Example Configuration of Cross-Connection Portions 70

FIG. 9 is a cross-sectional view taken along the line IX-IX of FIG. 8, and shows example configurations of the surroundings of the cross-connection portions 70 at the data bus line draw-out lines 22g formed in the gate layer on the substrate.

In FIG. 9, a data bus line draw-out line 22g (1) in the gate layer is formed on the base member 5a, and the gate insulating film 29 and the channel protection layer 30 are further formed on the base member 5a so as to cover the data bus line draw-out line 22g (1). A data bus line draw-out line 22g (2) is formed on the gate insulating film 29 and the channel protection layer 30. In a section where the data bus line draw-out line 22g (1) and the data bus line draw-out line 22g (2) overlap, a contact portion 62 is provided in which the data bus line draw-out line 22g (1) and the data bus line draw-out line 22g (2) are in contact with each other without the gate insulating film 29 and the channel protection layer 30 therebetween. The interlayer insulating film 31 is further formed on the gate insulating film 29, the channel protection layer 30, and the data bus line draw-out line 22g (2) so as to cover the same. The interlayer insulating film 33 is further formed on the interlayer insulating film 31. There are cases in which the interlayer insulating film (photosensitive organic film) 32 is formed between the interlayer insulating film 31 and the interlayer insulating film 33.

At the cross-connection portion 70, the data bus line draw-out line 22g (1) and the data bus line draw-out line 22g (2) are formed so as to overlap in a layer thickness direction. In a part of a region where the data bus line draw-out line 22g (1) and the data bus line draw-out line 22g (2) overlap, the gate insulating film 29 and the channel protection layer 30 are removed to bring these lines in contact with each other. At the contact portion 62 where the data bus line draw-out line 22g (1) and the data bus line draw-out lint 22g (2) are in contact with each other, a wire formed from the data bus line draw-out line 22g (1) in the gate layer is cross-connected to the data bus line draw-out line 22g (2) in the source layer.

It should be noted that, similarly to the aforementioned data bus line draw-out line 22g described with reference to FIG. 9, the data bus line draw-out lines 22r, 22b formed in the gate layer are cross-connected from the gate layer to the source layer via the cross-connection portions 70.

As shown in FIG. 8, the data bus line draw-out lines 22 have a larger line width at the cross-connection portions 70 than at any other portions. In this way, the rate of the occurrence of trouble, such as defective contact, in the cross-connection portions 70 can be lowered. For example, provided that each of the data bus line draw-out lines 22r, 22g, 22b has a widthwise dimension of 3 μm, the cross-connection portions 70 have an area of, for example, 19 μm×19 μm.

In concert with a portion of each data bus line draw-out line 22 at the cross-connection portion 70, which has a large line width, two neighboring data bus line draw-out lines 22 on the left and right thereof (e.g., the data bus line draw-out lines 22r and 22b on the right and left of the data bus line draw-out line 22g at the cross-connection portion 70) have a large wire interval therebetween. By thus increasing the interval between neighboring wires on both sides in accordance with the line width of the wire at each cross-connection portion 70, wires can be efficiently installed even in a region where a plurality of wires are concentrated.

The cross-connection portions 70 are staggered in such a manner that each cross-connection portion 70 is positionally shifted, in a direction in which wires extend, relative to another cross-connection portion 70 that neighbors it via the data bus line draw-out line 22. In this way, the plurality of cross-connection portions 70 can be efficiently installed, and the chance of the occurrence of a short circuit in the vicinity of two adjacent cross-connection portions 70 can be lowered.

By thus providing the cross-connection portions 70 between the fan-out portion FA and the second thin-film transistors 23 (an example of second switching elements) so as to cross-connect the data bus line draw-out lines 22 formed in the gate layer from the gate layer to the source layer, the data bus line draw-out lines 22 provided in separate layers, i.e., the gate layer and the source layer, can be kept long in the fan-out portion FA. Accordingly, the chance of a short circuit between neighboring data bus line draw-out lines 22 can be lowered.

Example Configuration of Second Thin-Film Transistors 23 (Second Switching Elements)

As shown in FIGS. 7 and 8, on the active matrix substrate 5 according to the present embodiment, the data bus line draw-out lines 22r, 22g, 22b are each connected to a branch wire 26a or 26b of the control line 26 formed in the gate layer (first conductive layer). The data bus line draw-out lines 22 are also connected to the corresponding first common wires 24 formed in the gate layer (first conductive layer) via the corresponding second thin-film transistors 23. Specifically, the data bus line draw-out lines 22r, 22g, and 22b are connected to the first common wires 24r, 24g, and 24b via terminal contact holes H3r, H3g, and H3b connected to connection wires 35r, 35g, and 35b, respectively.

FIG. 10 shows an example of a cross-section taken along the line X-X of FIG. 8. For example, in the vicinity of a second thin-film transistor 23b shown in the example of FIG. 10, the branch wire 26a of the control line 26, as well as the gate insulating film 29 that is formed so as to cover the branch wire 26a of the control line 26, is provided on the base member 5a of the active matrix substrate 5. It should be noted that a gate electrode 23bg of the second thin-film transistor 23b is formed from the branch wire 26a of the control line 26.

A semiconductor layer 23bh of the second thin-film transistor 23b, the channel protection layer 30, the data bus line draw-out line 22b, the connection wire 35b connected to the first common wire 24b via the terminal contact hole H3b, the interlayer insulating film 31, and the interlayer insulating film 33 are sequentially layered above the gate insulating film 29. For example, the semiconductor layer 23bh may be a conventional semiconductor layer made from amorphous silicon, or may be a high-mobility oxide semiconductor layer. It should be noted that the interlayer insulating film (photosensitive organic film) 32 may be formed between the interlayer insulating film 31 and the interlayer insulating film 33.

A drain electrode 23bd of the second thin-film transistor 23b is formed from the data bus line draw-out line 22b. A source electrode 23bs of the second thin-film transistor 23b is formed from the connection wire 35b.

It should be noted that an example configuration of a second thin-film transistor 23g is basically similar to that of the aforementioned second thin-film transistor 23b. Specifically, in the second thin-film transistor 23g, a gate electrode 23gg is formed from the branch wire 26b of the control line 26, a drain electrode 23gd is formed from the data bus line draw-out line 22g, and a source electrode 23gs is formed from the connection wire 35g that is connected to the first common wire 24g via the terminal contact hole H3g.

An example configuration of a second thin-film transistor 23r is equivalent to a configuration where the positions of the drain electrode 23bd and the source electrode 23bs of the aforementioned second thin-film transistor 23b are reversed. Specifically, in the second thin-film transistor 23r, a gate electrode 23rg is formed from the branch wire 26b of the control line 26, a drain electrode 23rd is formed from the data bus line draw-out line 22r, and a source electrode 23rs is formed from the connection wire 35r that is connected to the first common wire 24r via the terminal contact hole H3r.

In this way, the second thin-film transistor 23g and the second thin-film transistor 23r are connected at a position where they both oppose the common branch wire 26b of the control line 26 between the data bus line draw-out lines 22r and 22g. The branch wire 26b is orthogonal to the data bus line draw-out lines 22r and 22g. Accordingly, the plurality of second thin-film transistors 23 can be efficiently installed.

As shown in FIGS. 7 and 8, for example, each data bus line draw-out line 22r is provided with narrow portions 22ra, 22rb, 22rc, 22rd, and 22re with small widthwise dimensions, respectively at portions intersecting with the first common wire 24b, the branch wire 26a of the control line 26, the first common wire 24g, the branch wire 26b of the control line 26, and the first common wire 24r.

By thus providing the narrow portions 22ra, 22rb, 22rc, 22rd, 22re, the areas of intersections between the data bus line draw-out lines 22r and the first common wire 24b, the branch wire 26a of the control line 26, the first common wire 24g, the branch wire 26b of the control line 26, and the first common wire 24r can be reduced. As a result, the active matrix substrate 5 according to the present embodiment can inhibit a signal delay in the data bus lines D, and prevent a decrease in the display quality after mounting the chip of the data driver 16 (i.e., the display quality of the liquid crystal display apparatus 1 as a final product). Furthermore, during the inspection, a delay in an inspection control signal for the control line 26 can be inhibited. Therefore, at the time of display for the inspection, unevenness in display can be easily reduced, and erroneous detection of defects can be inhibited.

In addition to the foregoing description, for example, the widthwise dimension of the first common wire 24b, the branch wire 26a of the control line 26, the first common wire 24g, the branch wire 26b of the control line 26, or the first common wire 24r may be reduced so as to reduce the area of intersection with the corresponding data bus line draw-out lines 22r.

It is preferable to input, for example, a signal for placing the second thin-film transistors 23 (second switching elements) in an off state to the control line 26 via an FPC connection terminal 27c, especially in the stage as a final product. In this way, the second thin-film transistors 23 can be reliably placed in the off state, and a decrease in the display quality of the final product (e.g., shadowing) can be prevented.

Summary of First Embodiment

On the active matrix substrate 5 according to the present embodiment constructed in the foregoing manner, the first common wires 24r, 24g, 24b and the second thin-film transistors 23r, 23g, 23b are arranged between the fan-out portion FA and the mounting terminals DTr, DTg, DTb. Accordingly, unlike the conventional examples described earlier, the present embodiment enables detection of a short circuit and disconnection of the data bus line draw-out lines 22 formed in the fan-out portion FA using the second thin-film transistors 23r, 23g, 23b and the like, even when a frame region has been downsized or in the case of high definition.

In the present embodiment, the plurality of first common wires 24r, 24g, 24b are provided, and a predetermined number of gate bus lines G or a predetermined number of data bus lines D are connected to each of the plurality of common wires via a predetermined number of second thin-film transistors 23a. In this way, single-color display in the color of R, G, or B can be performed using the plurality of first common wires 24r, 24g, 24b, which makes it easy to detect a short circuit of the data bus lines D. Consequently, a high-precision lighting inspection can be carried out even when a frame region has been downsized or in the case of high definition.

In the present embodiment, among the plurality of data bus line draw-out lines 22, one of two neighboring data bus line draw-out lines 22 is formed from the same conductive layer as the gate bus lines G (first conductive layer), whereas the other of the two neighboring data bus line draw-out lines 22 is formed from the same conductive layer as the data bus lines D (second conductive layer). Accordingly, the interval between neighboring data bus line draw-out lines 22 can be reduced, and a region necessary for forming the data bus line draw-out lines 22 can be downsized. Consequently, the quality of the active matrix substrate 5 can be kept high even when a frame region has been downsized or in the case of high definition.

In the present embodiment, among the data bus line draw-out lines 22 formed from the same conductive layer as the gate bus lines G (first conductive layer), and among the data bus line draw-out lines 22 formed from the same conductive layer as the data bus lines D (second conductive layer), two neighboring draw-out lines are connected respectively to two different first common wires 24. Therefore, an inspection for disconnection and a short circuit can be carried out for each of data bus line draw-out lines 22 that are in different conductive layers (the first conductive layer and the second conductive layer) and neighbor each other, and for each of data bus line draw-out lines 22 that are in the same conductive layer (the first conductive layer or the second conductive layer) and neighbor each other. Accordingly, the inspection precision can be kept high.

In the present embodiment, oxide semiconductor layers are used for the semiconductor layers 18h of the first thin-film transistors 18 (first switching elements), the semiconductor layers 23bh of the second thin-film transistors 23 (second switching elements), or the like. In this case, the thin-film transistors can be further downsized and wires can be narrowed, and hence wires and elements can be efficiently installed even when a frame region has been downsized.

It should be noted that, in some cases, the second thin-film transistors 23r, 23g, 23b (second switching elements) according to the present embodiment are not covered by the counter substrate and driver chip. This leads to the possibility that a leak current is generated due to the incidence of external light, and the second thin-film transistors 23r, 23g, 23b malfunction. In order to prevent this, it is preferable that the second thin-film transistors 23r, 23g, 23b in the actual product be coated with resin or a tape with high light shielding properties, covered by a bezel, etc.

Especially, in the case where the pretilt angles and the initial alignment directions of liquid crystals are controlled by way of illumination with polarized ultraviolet light, it is preferable to shield the second thin-film transistors 23r, 23g, 23b (second switching elements) from light in advance in order to prevent malfunction of the second thin-film transistors 23r, 23g, 23b caused by such ultraviolet light.

Although the data bus lines D are provided on the gate bus lines G via the gate insulating film 29 in the present embodiment, the data bus lines D and the gate bus lines G may be reversed, i.e., the gate bus lines G may be provided on the data bus lines D via the insulating film.

Second Embodiment

Figure 11:
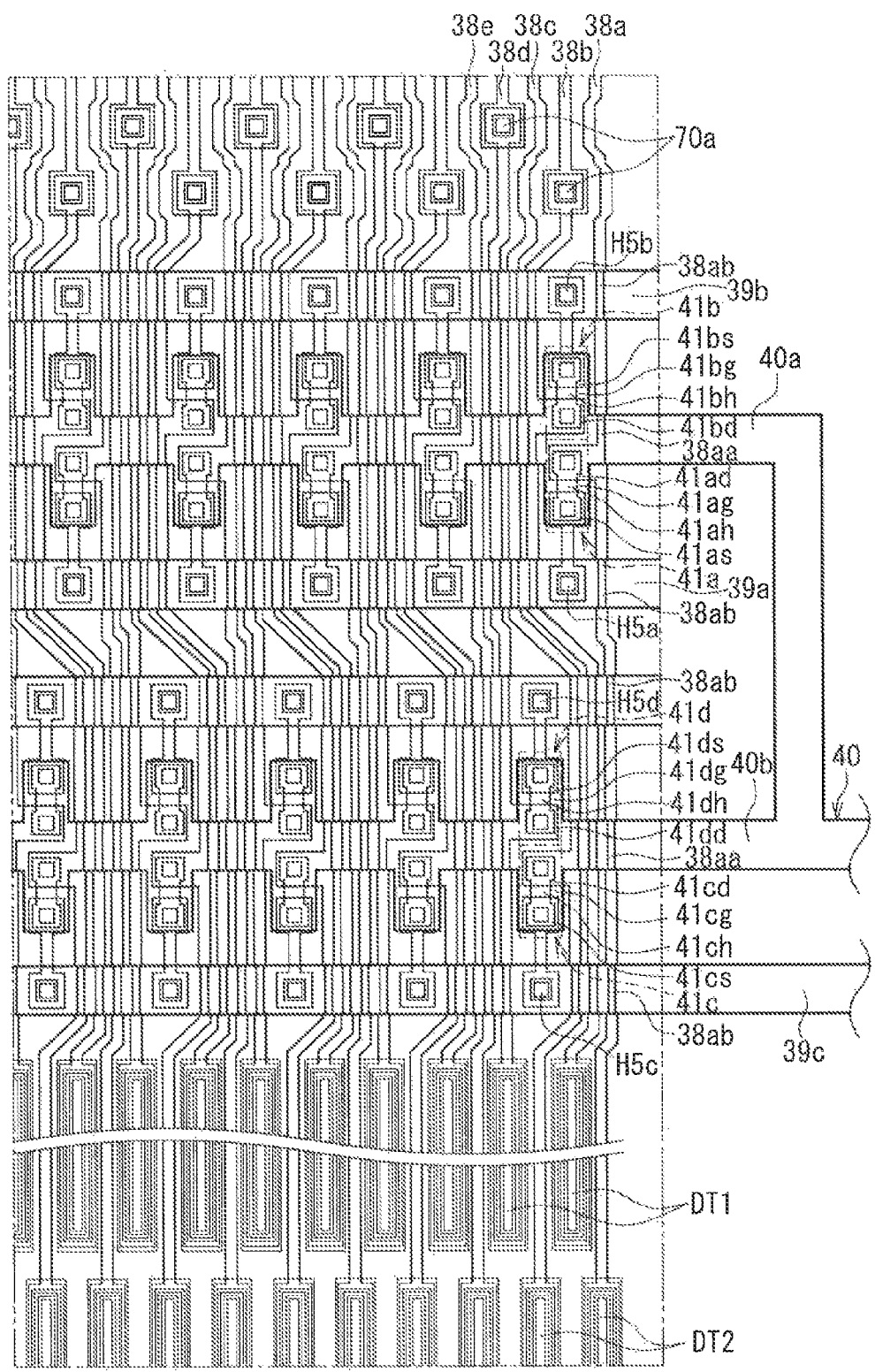
FIG. 11 is a diagram for describing configurations of main elements of an active matrix substrate according to a second embodiment of the present invention.

FIG. 11 is a diagram for describing configurations of main elements of the aforementioned active matrix substrate according to a second embodiment of the present invention.

Referring to FIG. 11, the present embodiment differs from the first embodiment described earlier mainly in that a portion on which a gate driver is mounted is provided with mounting terminals, second thin-film transistors, and first common wires. It should be noted that the elements that are common to the first embodiment described earlier are given the same reference numerals, and a redundant description thereof is omitted.

In FIG. 11, an active matrix substrate 5 according to the present embodiment uses a gate driver (not shown) composed of a driver chip in place of gate drivers 17a, 17b that are monolithically formed, and this gate driver is mounted on mounting terminals DT1, DT2.

A portion on which this gate driver is mounted is provided with gate bus line draw-out lines 38a, 38b, 38c, 38d connected to gate bus lines G, cross-connection portions 70a, and second thin-film transistors 41a, 41b, 41c, 41d serving as second switching elements. The gate bus line draw-out lines 38a, 38b, 38c, 38d are each connected to a mounting terminal DT1 or DT2.

As shown in FIG. 11, the rightmost gate bus line draw-out line 38a is connected to a first common wire 39a via the thin-film transistor 41a and a terminal contact hole H5a. The gate bus line draw-out line 38b on the left thereof is cross-connected from a gate layer to a source layer at the cross-connection portion 70a, and then connected to a first common wire 39b via the thin-film transistor 41b and a terminal contact hole H5b. The gate bus line draw-out line 38c on the left thereof is connected to a first common wire 39c via the thin-film transistor 41c and a terminal contact hole H5c. The gate bus line draw-out line 38d on the left thereof is cross-connected from the gate layer to the source layer at the cross-connection portion 70a, and then connected to a first common wire 39d via the thin-film transistor 41d and a terminal contact hole H5d.

That is to say, the gate bus line draw-out lines 38a and 38c are both formed from the same conductive layer as data bus lines D, but these gate bus line draw-out lines 38a and 38c are connected respectively to different first common wires 39a and 39c. The gate bus line draw-out lines 38b and 38d are both formed from the same conductive layer as gate bus lines G at an upper side (an upper side of the sheet of FIG. 11) relative to the cross-connection portions 70a, but these gate bus line draw-out lines 38b and 38d are connected respectively to different first common wires 39b and 39d. It should be noted that the gate bus line draw-out lines 38a, 38b, 38c are each connected to the mounting terminal DT1 or DT2.

Similarly to the second thin-film transistor 23b shown in the example of FIG. 10, the second thin-film transistor 41a includes a gate electrode 41ag constructed integrally with a branch wire 40a of a control line 40, a semiconductor layer 41ah constructed from an oxide semiconductor, a drain electrode 41ad constructed integrally with the data bus line draw-out line 38a, and a source electrode 41as formed from the same conductive layer as the data bus lines D.

Similarly, the second thin-film transistor 41b includes a gate electrode 41bg constructed integrally with the branch wire 40a of the control line 40, a semiconductor layer 41bh constructed from an oxide semiconductor, a drain electrode 41bd constructed integrally with the data bus line draw-out line 38b, and a source electrode 41bs formed from the same conductive layer as the data bus lines D.

Similarly, the second thin-film transistor 41c includes a gate electrode 41cg constructed integrally with a branch wire 40b of the control line 40, a semiconductor layer 41ch constructed from an oxide semiconductor, a drain electrode 41cd constructed integrally with the data bus line draw-out line 38c, and a source electrode 41cs formed from the same conductive layer as the data bus lines D.

Similarly, the second thin-film transistor 41*d* includes a gate electrode 41*dg* constructed integrally with the branch wire 40*b* of the control line 40, a semiconductor layer 41*dh* constructed from an oxide semiconductor, a drain electrode 41*dd* constructed integrally with the data bus line draw-out line 38*d*, and a source electrode 41*ds* formed from the same conductive layer as the data bus lines D.

As shown in FIG. 11, among the draw-out lines 38*b*, 38*d* formed from the same conductive layer as the gate bus lines G, and among the draw-out lines 38*a*, 38*c* formed from the same conductive layer as the data bus lines D, two neighboring draw-out lines are connected respectively to two different first common wires 39.

Specifically, the gate bus line draw-out lines 38*b* and 38*d* are both formed from the same conductive layer as the gate bus lines G, but these gate bus line draw-out lines 38*b* and 38*d* are connected respectively to different first common wires 39*b* and 39*d*. The gate bus line draw-out lines 38*a* and 38*c* are both formed from the same conductive layer as the data bus lines D, but these gate bus line draw-out lines 38*a* and 38*c* are connected respectively to different first common wires 39*a* and 39*c*.

As shown in FIG. 11, the gate bus line draw-out line 38*a* is provided with narrow portions 38*aa* with small widthwise dimensions at portions intersecting with the branch wires 40*a*, 40*b* of the control line 40. Similarly, the gate bus line draw-out line 38*a* is provided with narrow portions 38*ab* with small widthwise dimensions at portions intersecting with the first common wires 39*a*, 39*b*, 39*c*, 39*d*. Although reference numerals are not given, as shown in FIG. 11, the gate bus line draw-out lines 38*b*, 38*c*, 38*d* are provided with narrow portions with small widthwise dimensions at portions intersecting with the branch wires 40*a*, 40*b* of the control line 40, and at portions intersecting with the first common wires 39*a*, 39*b*, 39*c*, 39*d*.

By thus providing the narrow portions (e.g., the narrow portions 38*aa* and the narrow portions 38*ab*) in the gate bus line draw-out lines 38 at portions intersecting with the control line 40 and the first common wires 39, the areas of intersections between the gate bus line draw-out lines 38 and the control line 40, as well as the areas of intersections between the gate bus line draw-out lines 38 and the first common wires 39, can be reduced. As a result, the active matrix substrate 5 according to the present embodiment can inhibit a signal delay in the gate bus lines G, and prevent a decrease in the display quality after mounting the chip of the gate driver (i.e., the display quality of a liquid crystal display apparatus 1 as a final product). Furthermore, during the inspection, a delay in an inspection control signal for the control line 40 can be inhibited. Therefore, at the time of display for the inspection, unevenness in display can be easily reduced, and erroneous detection of defects can be inhibited.

In addition to the foregoing description, for example, the widthwise dimensions of the branch wires 40*a*, 40*b* of the control line 40 may be reduced so as to reduce the areas of intersections between the gate bus line draw-out lines 38 and the control line 40. That is to say, at the aforementioned intersecting portions, at least one of a group of the gate bus line draw-out lines 38 and the control line 40 may be narrowed.

With the foregoing configurations, the present embodiment can achieve the functions and effects similar to those achieved by the first embodiment described earlier. Furthermore, in the present embodiment, it is easy to detect a short circuit between two neighboring gate bus line draw-out lines 38 formed in the same layer.

For example, in FIG. 11, the gate bus line draw-out line 38*a* formed in the source layer can be inspected by inputting an inspection signal to the first common wire 39*a*. In this case, for example, it is determined that a short circuit has occurred if a pixel corresponding to the gate bus line connected to the gate bus line draw-out line 38*c* formed in the same source layer is lit.

For example, in FIG. 11, the gate bus line draw-out line 38*b* formed in the gate layer can be inspected by inputting a signal to the first common wire 39*b*. In this case, for example, it is determined that a short circuit has occurred if a pixel corresponding to the gate bus line connected to the gate bus line draw-out line 38*d* formed in the same gate layer is lit.

Third Embodiment

Figure 12:
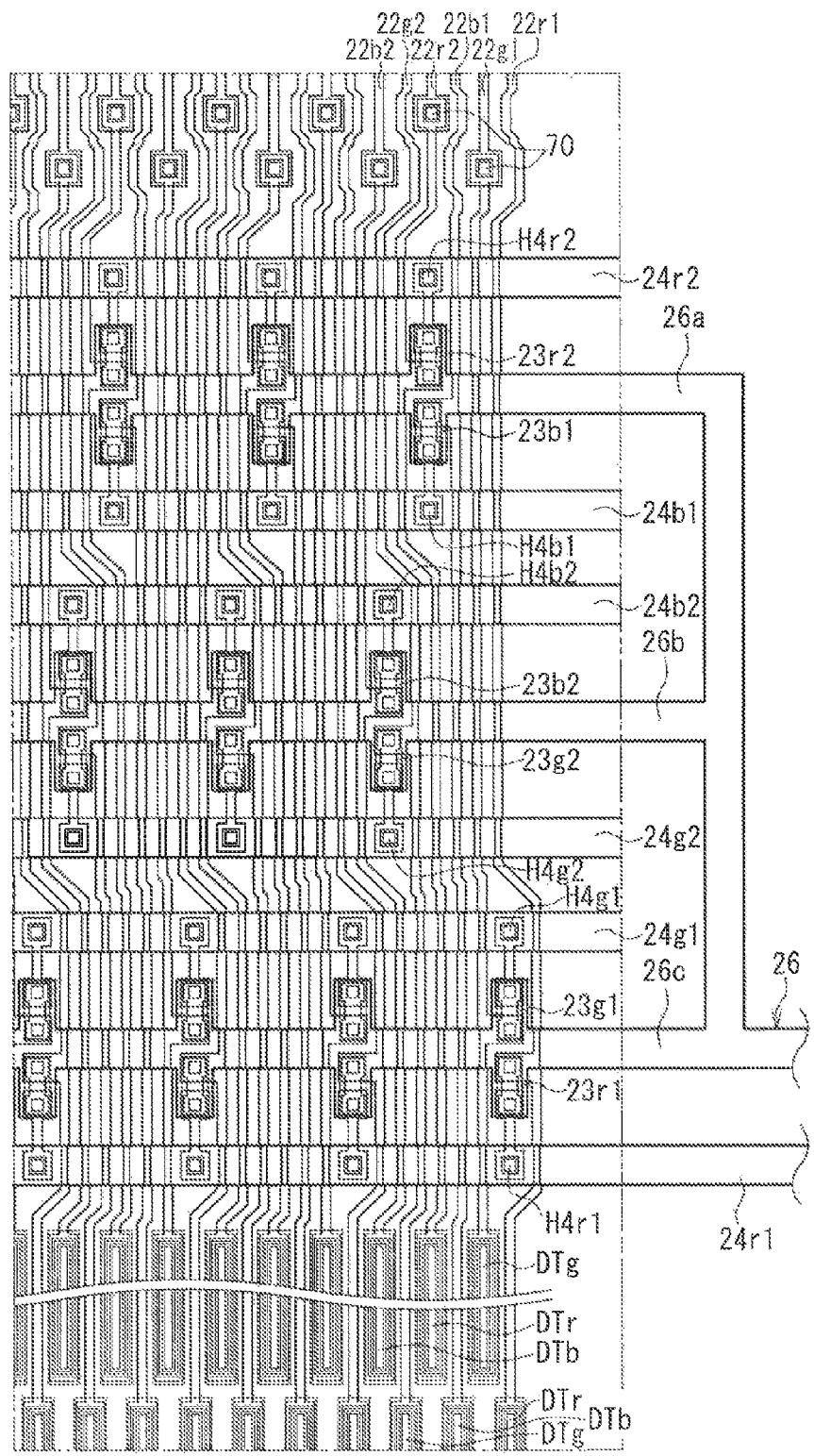
FIG. 12 is a diagram for describing configurations of main elements of the aforementioned active matrix substrate according to a third embodiment of the present invention.

FIG. 12 is a diagram for describing configurations of main elements of the aforementioned active matrix substrate according to a third embodiment of the present invention. Referring to FIG. 12, the present embodiment differs from the first embodiment described earlier mainly in that six first common wires are provided so that, for each of R, G, and B, draw-out lines formed from the same conductive layer as gate bus lines are connected to the same first common wire, and draw-out lines formed from the same conductive layer as data bus lines are connected to the same first common wire. It should be noted that the elements that are common to the first embodiment described earlier are given the same reference numerals, and a redundant description thereof is omitted.

As shown in FIG. 12, the rightmost data bus line draw-out line 22*r*1 is connected to a first common wire 24*r*1 via a second thin-film transistor 23*r*1 and a terminal contact hole H4*r*1. A data bus line draw-out line 22*g*1 on the left thereof is connected to a first common wire 24*g*1 via a second thin-film transistor 23*g*1 and a terminal contact hole H4*g*1. A data bus line draw-out line 22*b*1 on the left thereof is connected to a first common wire 24*b*1 via a second thin-film transistor 23*b*1 and a terminal contact hole H4*b*1.

A data bus line draw-out line 22*r*2 on the left of the data bus line draw-out line 22*b*1 is connected to a first common wire 24*r*2 via a second thin-film transistor 23*r*2 and a terminal contact hole H4*r*2. A data bus line draw-out line 22*g*2 on the left thereof is connected to a first common wire 24*g*2 via a second thin-film transistor 23*g*2 and a terminal contact hole H4*g*2. A data bus line draw-out line 22*b*2 on the left thereof is connected to a first common wire 24*b*2 via a thin-film transistor 24*b*2 and a terminal contact hole H4*b*2.

It should be noted that, in the present embodiment, a control line 26 is split into branch wires 26*a*, 26*b*, 26*c* as shown in FIG. 12. The configuration of the second thin-film transistors 23*r*1, 23*g*1, 23*b*1, 23*r*2, 23*g*2, 23*b*2 is basically similar to that of the second thin-film transistor 23*b* shown in FIG. 10.

The data bus line draw-out lines 22*r*1, 22*b*1, 22*g*2 are formed from the same conductive layer as data bus lines D, whereas the data bus line draw-out lines 22*g*1, 22*r*2, 22*b*2 are formed from the same conductive layer as gate bus lines G.

As shown in FIG. 12, among the draw-out lines 22*r*1, 22*b*1, 22*g*2 formed from the same conductive layer as the data bus lines D, and among the draw-out lines 22*g*1, 22*r*2, 22*b*2 formed from the same conductive layer as the gate bus lines G, two neighboring draw-out lines are connected respectively to two different first common wires 24.

Specifically, the data bus line draw-out lines 22*r*1 and 22*b*1 are both formed from the same conductive layer as the data bus lines D, but these data bus line draw-out lines 22*r*1 and 22*b*1 are connected to different first common wires 24*r*1 and 24*b*1, respectively. The draw-out lines 22*g*1 and 22*r*2 are both formed from the same conductive layer as the gate bus lines G, but these draw-out lines 22*g*1 and 22*r*2 are connected to different first common wires 24*g*1 and 24*r*2, respectively.

With the foregoing configurations, the present embodiment can achieve the functions and effects similar to those achieved by the second embodiment described earlier. Furthermore, in the present embodiment, it is easy to detect a short circuit between two neighboring data bus line draw-out lines 22 formed in the same layer for each of the colors R, G, B.

For example, in FIG. 12, the data bus line draw-out line 22*b*1 formed in the source layer can be inspected by inputting an inspection signal to the first common wire 24*b*1. In this case, it is determined that a short circuit has occurred if a pixel corresponding to the data bus line of a different color connected to the data bus line draw-out line 22*r*1 or 22*g*2 formed in the same source layer is lit.

For example, in FIG. 12, the data bus line draw-out line 22*r*2 formed in the gate layer can be inspected by inputting a signal to the first common wire 24*r*2. In this case, it is determined that a short circuit has occurred if a pixel corresponding to the data bus line of a different color connected to the data bus line draw-out line 22*g*1 or 22*b*2 formed in the same gate layer is lit.

Fourth Embodiment

Figure 13:
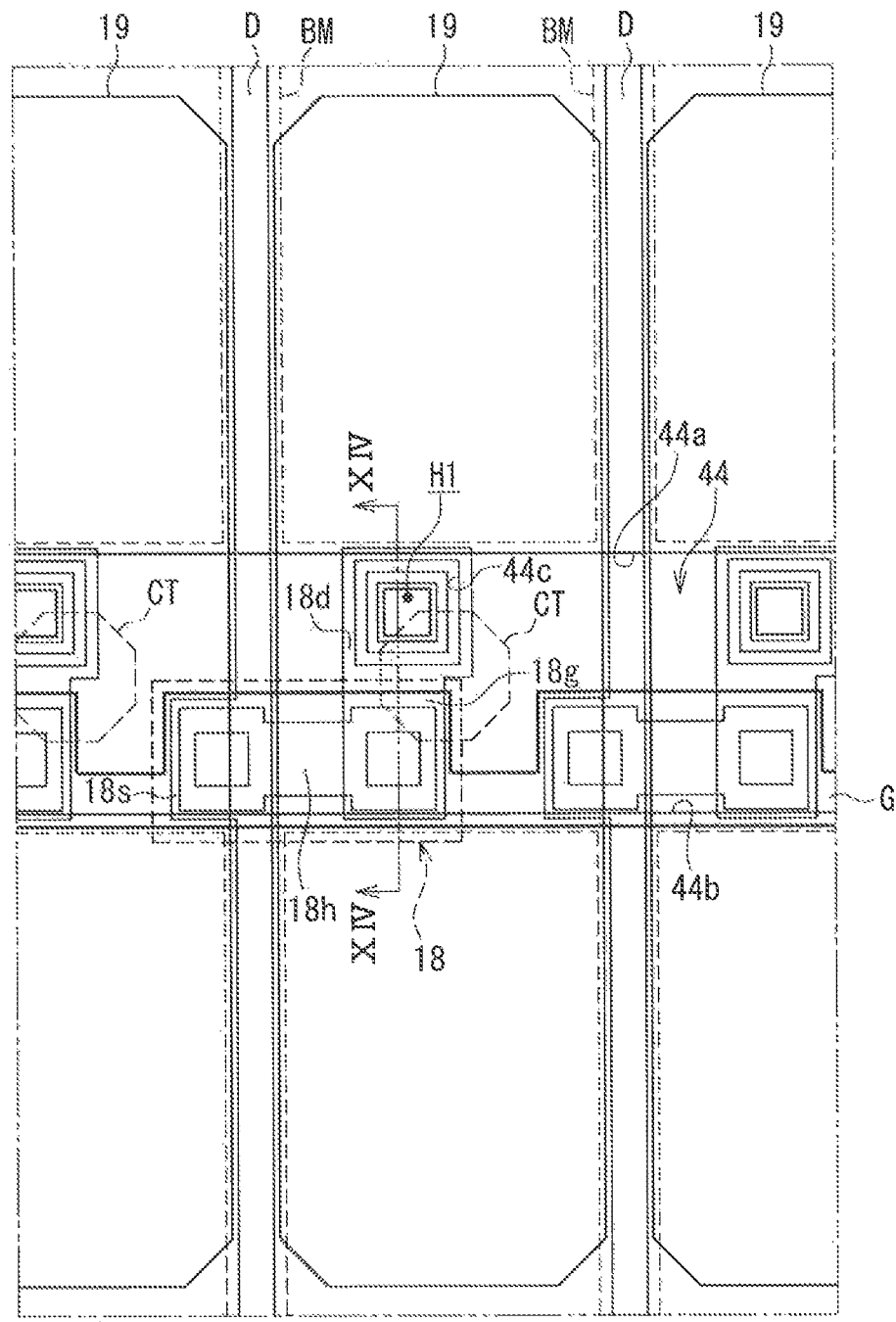
FIG. 13 is a diagram for describing configurations of the surroundings of pixels on an active matrix substrate according to a fourth embodiment of the present invention.
Figure 14:
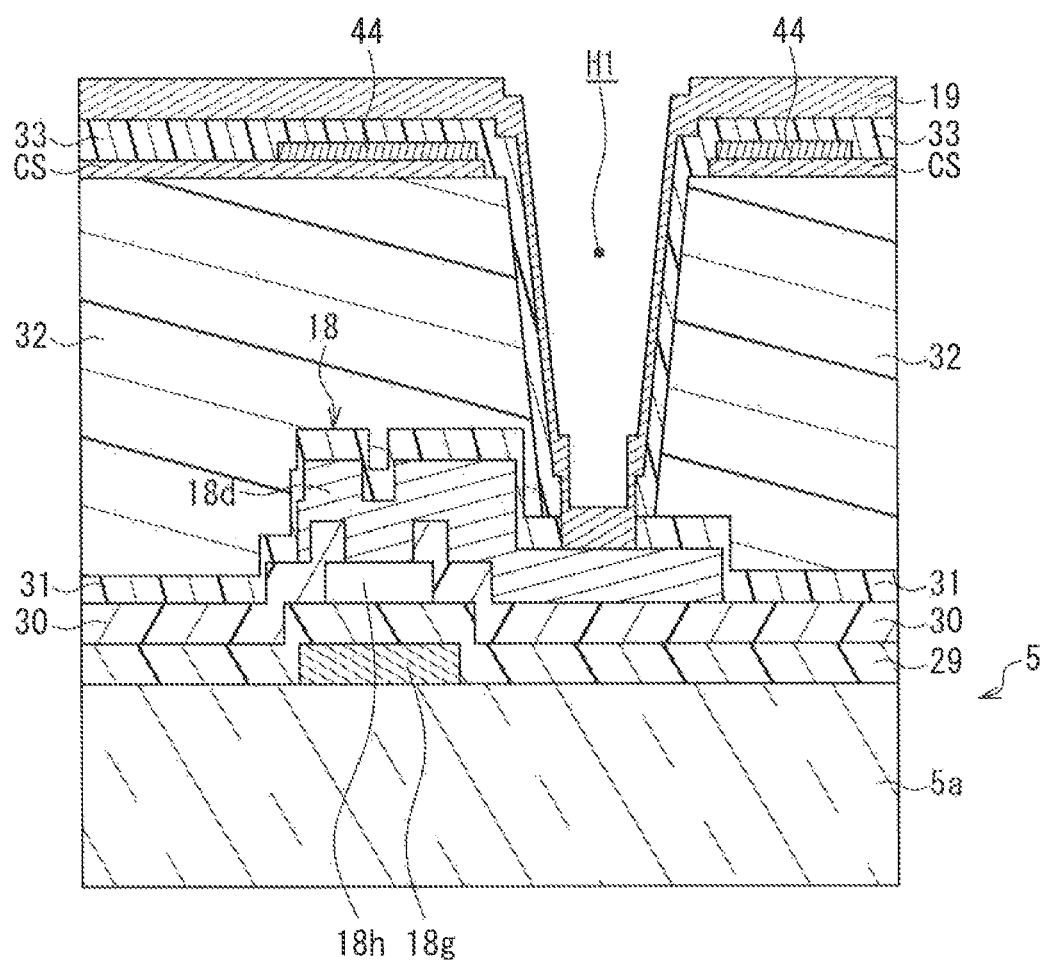
FIG. 14 is a cross-sectional view taken along the line XIV-XIV of FIG. 13.
Figure 15:
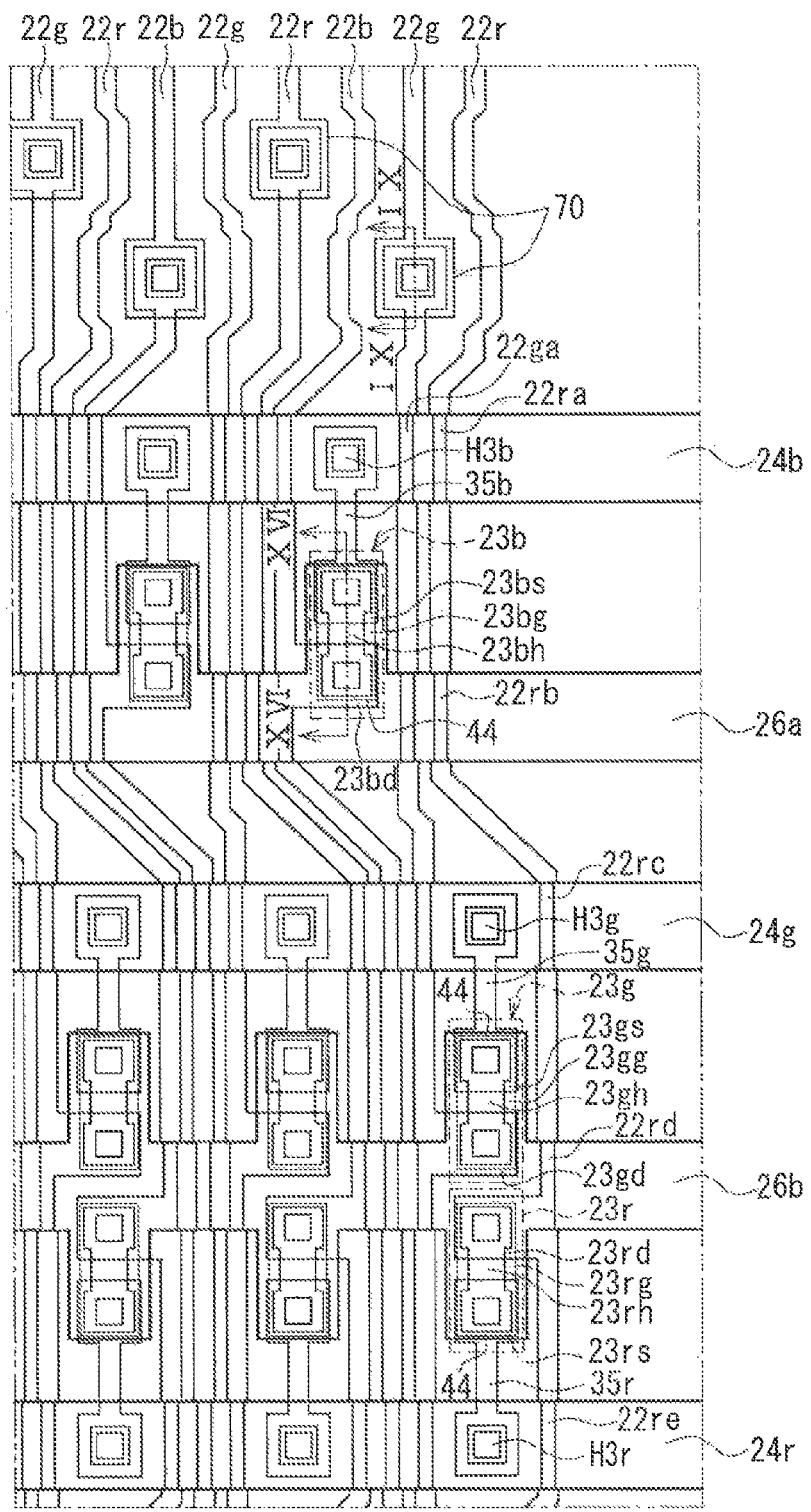
FIG. 15 is a diagram for describing configurations of main elements of the aforementioned active matrix substrate.
Figure 16:
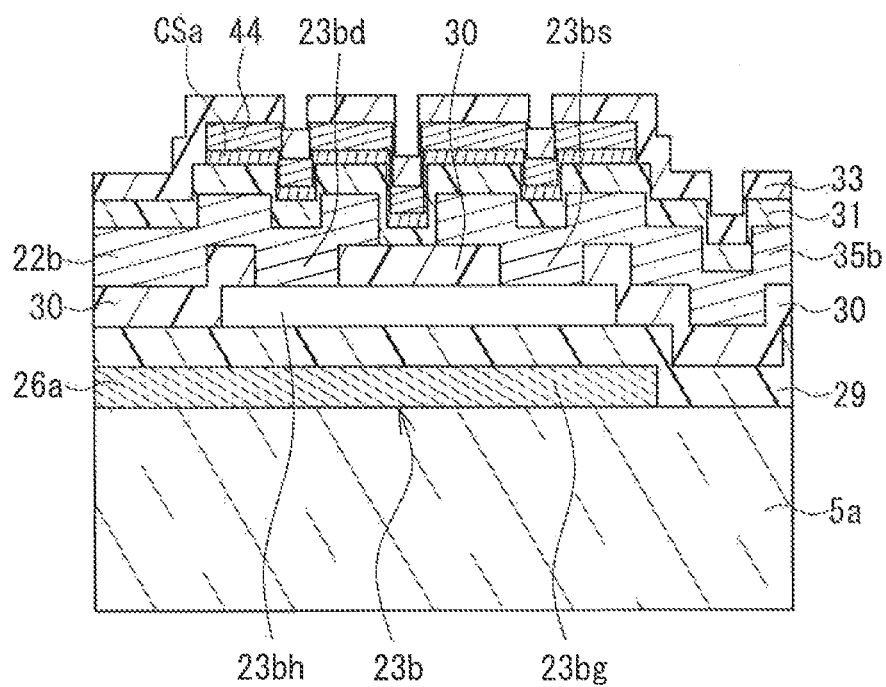
FIG. 16 is a cross-sectional view taken along the line XVI-XVI of FIG. 15.

FIG. 13 is a diagram for describing configurations of the surroundings of pixels on an active matrix substrate according to a fourth embodiment of the present invention. FIG. 14 is a cross-sectional view taken along the line XIV-XIV of FIG. 13. FIG. 15 is a diagram for describing configurations of main elements of the aforementioned active matrix substrate. FIG. 16 is a cross-sectional view taken along the line XVI-XVI of FIG. 15.

Referring to these figures, the present embodiment differs from the first embodiment described earlier mainly in that light shielding films are formed to shield first thin-film transistors 18 and second thin-film transistors 23 from light. It should be noted that the elements that are common to the first embodiment described earlier are given the same reference numerals, and a redundant description thereof is omitted.

For example, in the case where an auxiliary capacitance electrode CS is formed using transparent electrodes made from indium tin oxide (ITO), indium zinc oxide (IZO), and the like, the resistance increases and a common signal is delayed as a display region is enlarged. The delay in the common signal promotes the occurrence of defective display, such as flickering and shadowing, and causes a decrease in the display quality. In this case, by layering metal electrodes on the transparent electrodes, the resistance can be reduced and the aforementioned defective display can be inhibited.

As shown in FIGS. 13 and 14, on an active matrix substrate 5 according to the present embodiment, metal electrodes 44 are formed in a layer above the auxiliary capacitance electrode CS as light shielding films for the first thin-film transistors 18 around the pixels. On the aforementioned active matrix substrate 5, an interlayer insulating film 31 is provided so as to cover the first thin-film transistors 18 (first switching elements), and the auxiliary capacitance electrode CS is provided in a layer above the interlayer insulating film 31 via an interlayer insulating film (photosensitive organic film) 32. The metal electrodes 44 are provided in the layer above the auxiliary capacitance electrode CS, and pixel electrodes 19 are provided in a layer above the auxiliary capacitance electrode CS and the metal electrodes 44 via an interlayer insulating film (e.g., SiNx).

As shown in FIG. 13, each metal electrode 44 has edges 44*a* and 44*b* at its upper end and lower end, and is arranged in the form of a strip so as to cover drain electrodes 18*d*, gate electrodes 18*g*, and semiconductor layers 18*h* of the first thin-film transistors 18 (first switching elements). Openings 44*c* of the metal electrodes 44 are provided at contact holes H1. It should be noted that molybdenum (Mo), titanium (Ti), aluminum (Al), or an alloy or layered films thereof can be used as the metal electrodes 44.

As shown in FIGS. 15 and 16, on the aforementioned active matrix substrate 5, the aforementioned metal electrodes 44 are provided also as light shielding films covering the second thin-film transistors 23 (second switching elements). For example, the interlayer insulating film (SiNx) 31 is provided in a layer above gate electrodes 23*bg*, semiconductor layers 23*bh*, drain electrodes 23*bd*, and source electrodes 23*bs* of second thin-film transistors 23*b*. An electrode film CSa formed from the same conductive layer as the auxiliary capacitance electrode CS is provided in a layer above the interlayer insulating film 31, the metal electrodes 44 are provided in a layer above the electrode film CSa, and an interlayer insulating film 33 is provided in a layer above the electrode film CSa and the metal electrodes 44.

It should be noted that the metal electrodes 44 are provided also for second thin-film transistors 23*r* and 23*g*, similarly to the aforementioned second thin-film transistors 23*b*.

The aforementioned metal electrodes 44 shown in FIGS. 15 and 16 are formed on a base member 5*a* (FIG. 14) using the same metal material as the metal electrodes 44 shown in FIGS. 13 and 14 (a plurality of types of metal material having a single-layer or layered structure), through the same manufacturing processes as the metal electrodes 44 shown in FIGS. 13 and 14. On the other hand, the aforementioned electrode film CSa is formed above the base member 5*a* using the same metal material as the auxiliary capacitance electrode CS shown in FIG. 14 (a plurality of types of metal material having a single-layer or layered structure), through the same manufacturing processes as the auxiliary capacitance electrode CS shown in FIG. 14. In this way, the light shielding films (metal electrodes) for shielding the second thin-film transistors 23 (second switching elements) from light can be easily formed without adding special processes.

In order to inhibit the generation of a leak current, which will be described later, it is preferable to form the metal electrodes 44 so as to completely cover channel portions of second thin-film transistors 23*a* when viewed from a direction perpendicular to a substrate surface of the active matrix substrate 5.

With the foregoing configurations, the present embodiment can not only achieve the functions and effects similar to those achieved by the first embodiment described earlier, but also prevent malfunction of the second thin-film transistors 23 (second switching elements).

That is to say, in the present embodiment, the metal electrodes shield the second thin-film transistors 23 (second switching elements) from light. In this way, it is possible to prevent malfunction of the second thin-film transistors 23 (second switching elements) triggered by the generation of a leak current associated with the incidence of external light, and the inspection precision can be kept high. In order to prevent malfunction of the second thin-film transistors 23 (second switching elements), the second thin-film transistors 23 (second switching elements) can be reliably shielded from light without being coated with resin or a tape with high light shielding properties or covered by a bezel.

In addition to the foregoing description, the metal electrodes 44 may be provided in a layer below the auxiliary capacitance electrode CS, or the installation of the electrode film CSa may be omitted.

Fifth Embodiment

Figure 18:
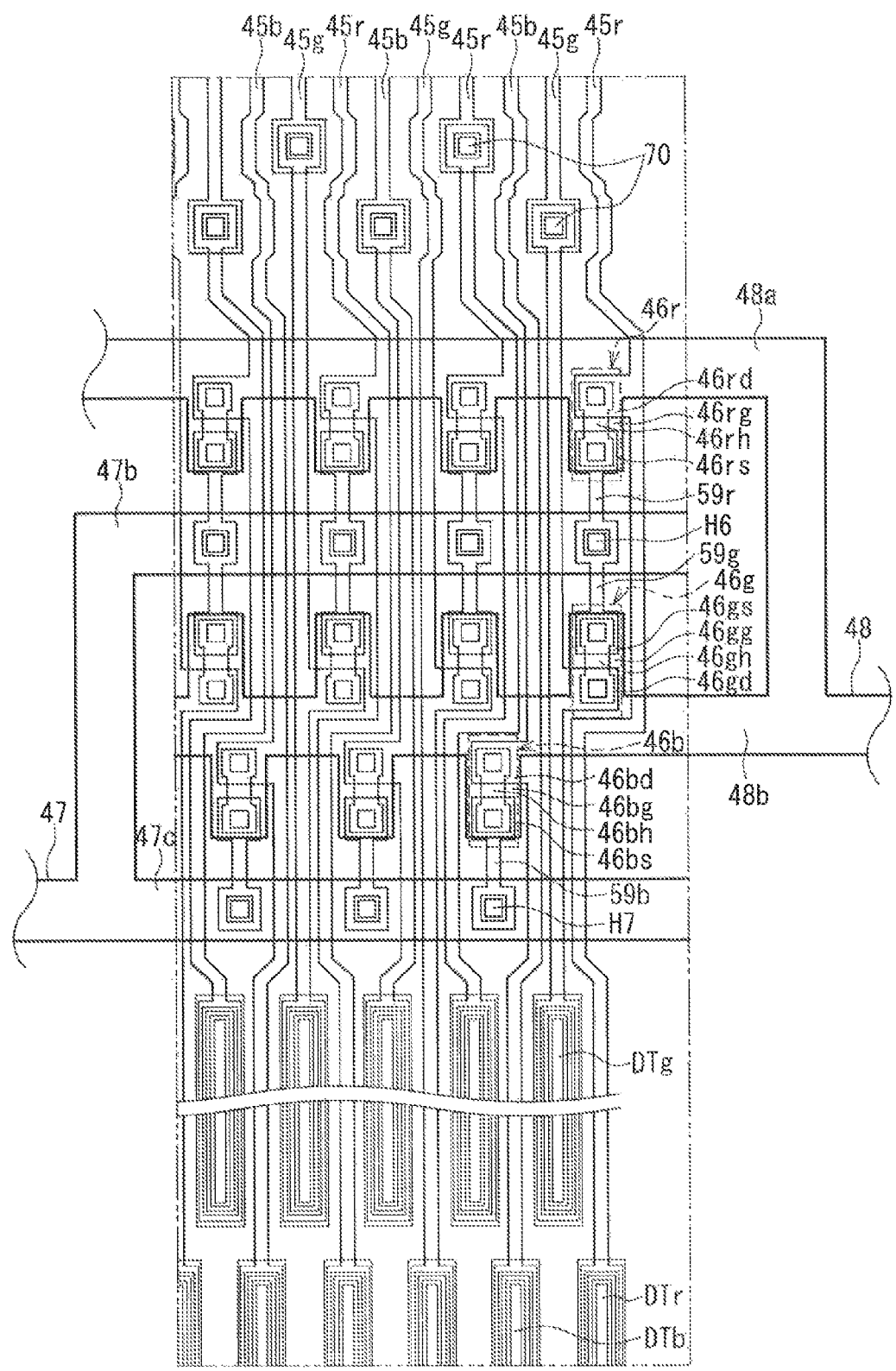
FIG. 18 is a diagram for describing configurations of main elements of the aforementioned active matrix substrate in a section with a portion on which a data driver is mounted.
Figure 19:
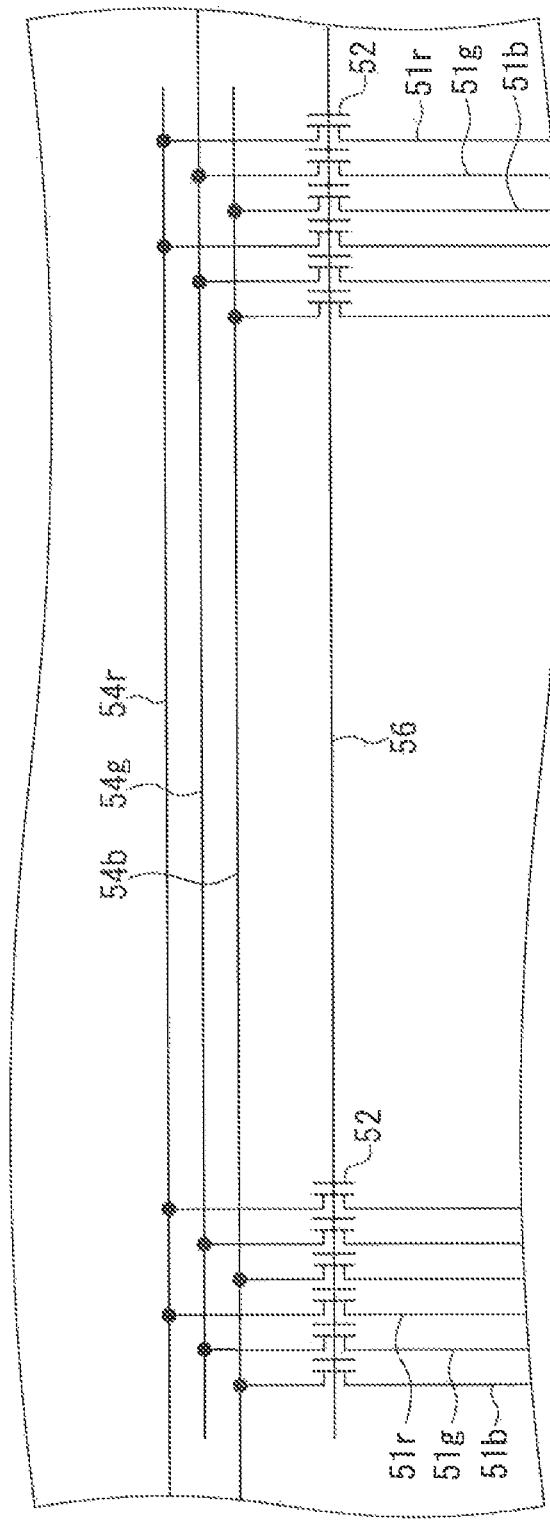
FIG. 19 is a diagram for describing configurations of main elements of the aforementioned active matrix substrate in a section that is opposite from the portion on which the data driver is mounted.

FIG. 17 is a diagram for describing configurations of main elements of an active matrix substrate according to a fifth embodiment of the present invention. FIG. 18 is a diagram for describing configurations of main elements of the aforementioned active matrix substrate in a section with a portion on which a data driver is mounted. FIG. 19 is a diagram for describing configurations of main elements of the aforementioned active matrix substrate in a section that is opposite from the portion on which the data driver is mounted.

Referring to these figures, the present embodiment differs from the first embodiment described earlier mainly in that third thin-film transistors are provided to end portions of data bus lines that are not connected to mounting terminals, and also in that second common wires that are connected in common to the plurality of data bus lines via the third thin-film transistors are provided. It should be noted that the elements that are common to the first embodiment described earlier are given the same reference numerals, and a redundant description thereof is omitted.

As shown in FIG. 17, a driver chip (not shown) into which a gate driver and a data driver are integrated is mounted on a region Ba of an active matrix substrate 5 according to the present embodiment.

Similarly to the case of FIG. 11 according to the second embodiment, gate bus line draw-out lines 38 are connected to gate bus lines G. The gate bus line draw-out lines 38 include gate bus line draw-out lines 38*b*, 38*d* formed from the same conductive layer as the gate bus lines G, and gate bus line draw-out lines 38*a*, 38*c* formed from the same conductive layer as data bus lines D. As shown in FIG. 11, second thin-film transistors 41, first common wires 39, and mounting terminals DT1 or DT2 are sequentially connected to the gate bus line draw-out lines 38. Terminals 50 are connected to the first common wires 39. For example, an inspection signal in inspection processing for the gate bus lines G is supplied thereto. The gate bus line draw-out lines 38 include a fan-out portion FA2 that is drawn out from a section where the plurality of mounting terminals are provided toward a section where the plurality of gate bus lines G are provided. For example, in FIG. 17, the fan-out portion FA2 is a portion in which the plurality of gate bus line draw-out lines 38 connecting the gate bus lines G and the mounting terminals are arranged at an angle with respect to the direction of arrangement of the data bus lines D.

Data bus line draw-out lines 45, later-described mounting terminals, second thin-film transistors 46, and a first common wire 47 are sequentially connected to the aforementioned driver chip side of the data bus lines D. The data bus line draw-out lines 45 include a fan-out portion FA that is drawn out from a section where the plurality of mounting terminals are provided toward a section where the plurality of data bus lines D are provided.

A terminal 47*a* is connected to the first common wire 47. For example, an inspection signal and voltage in inspection processing for the data bus lines D are supplied thereto. Specifically, as shown in FIG. 18, data bus line draw-out lines 45*r*, 45*g*, and 45*b* are provided, for example, in correspondence with the colors R, G, and B, respectively. The data bus line draw-out lines 45*r*, 45*g*, and 45*b* are connected to the data bus lines D corresponding to R, G, and B, respectively. Among the data bus line draw-out lines 45*r*, 45*g*, 45*b*, neighboring lines are formed in different layers (a gate layer and a source layer). As described earlier in the first embodiment with reference to FIGS. 8 and 9, the data bus line draw-out lines 45 formed in the gate layer are cross-connected to the source layer at cross-connection portions 70.

The data bus line draw-out lines 45*r*, 45*g*, and 45*b* are connected to second thin-film transistors 46*r*, 46*g*, and 46*b*, respectively, and to a control line 48. The first common wire 47 that is split into branch wires 47*b* and 47*c* is connected to the second thin-film transistors 46*r*, 46*g*, 46*b* via terminal contact holes H6 or H7.

Similarly to the second thin-film transistor 23*r* shown in the example of FIG. 8, each second thin-film transistor 46*r* includes a gate electrode 46*rg* constructed integrally with a branch wire 48*a* of the control line 48, a semiconductor layer 46*rh* constructed from an oxide semiconductor, a drain electrode 46*rd* constructed integrally with the aforementioned data bus line draw-out line 45*r*, and a source electrode 46*rs* constituted by an end portion of a connection wire 59*r* formed from the same conductive layer as the data bus lines D. It should be noted that the connection wire 59*r* is a wire connecting to the branch wire 47*b* of the first common wire 47 via the terminal contact hole H6.

An example configuration of the second thin-film transistors 46*g* is equivalent to a configuration where the positions of the drain electrodes 46*rd* and the source electrodes 46*rs* of the aforementioned second thin-film transistors 46*r* are reversed. Specifically, each thin-film transistor 46*g* includes a gate electrode 46*gg* formed from a branch wire 48*b* of the control line 48, a drain electrode 46*gd* formed from the data bus line draw-out line 45*g*, and a source electrode 46*gs* constituted by an end portion of a connection wire 59*g* connected to the branch wire 47*b* of the common wire 47. It should be noted that the connection wire 59*g* is a wire connecting to the branch wire 47*b* of the first common wire 47 via the terminal contact hole H6.

An example configuration of the thin-film transistors 46*b* is similar to that of the aforementioned thin-film transistors 46*r*. Specifically, each thin-film transistor 46*b* includes a gate electrode 46*bg* constructed integrally with the branch wire 48*b* of the control line 48, a semiconductor layer 46*bh* constructed from an oxide semiconductor, a drain electrode 46*bd* constructed integrally with the aforementioned data bus line draw-out line 45*b*, and a source electrode 46*bs* constituted by an end portion of a connection wire 59*b* formed from the same conductive layer as the data bus lines D. It should be noted that the connection wire 59*b* is a wire connecting to the branch wire 47*c* of the first common wire 47 via the terminal contact hole H7.

As shown in FIG. 17, the control line 48 controls operations to turn on/off the aforementioned second thin-film transistors 41, 46. A terminal 49*a* is connected to the control line 48. The terminal 49*a* is also connected to an input terminal 49*c* via a wire 49*b*. FPC connection terminals of the aforementioned FPC 8 are connected to the input terminal 49*c*. When performing inspection processing and voltage application processing, a control signal for performing an operation to turn on/off each of the second thin-film transistors 41, 46 is input from the terminal 49*a* or the input terminal 49*c*. In a liquid crystal display apparatus 1 as a final product, a signal for turning off each of the second thin-film transistors 41, 46 is input to the input terminal 49*c* via the aforementioned FPC 8.

As shown in FIG. 17, end portions of the data bus lines D that are not connected to the mounting terminals are drawn out to the outside of an effective display region A by a plurality of draw-out lines 51. A third thin-film transistor 52 serving as a third switching element and a connection wire 53 are sequentially connected to each of the plurality of draw-out lines 51. Each of the plurality of connection wires 53 is connected to one of three second common wires 54.

A control line 56 controls operations to turn on/off the third thin-film transistors 52. That is to say, gate electrodes (not shown) of the third thin-film transistors 52 are constructed integrally with the control line 56. A terminal 57 is connected to the control line 56. The terminal 57 is also connected to an input terminal 58 via a wire. The FPC connection terminals of the aforementioned FPC 8 are connected to the input terminal 58. When performing the inspection processing and the voltage application processing, a control signal for performing operations to turn on/off the third thin-film transistors 52 is input from the terminal 57 or the input terminal 58. In the liquid crystal display apparatus 1 as a final product, a signal for turning off each of the third thin-film transistors 52 is input to the input terminal 58 via the aforementioned FPC 8.

The second common wires 54 are connected to corresponding terminals 55 via wires. For example, an inspection signal and voltage in inspection processing for the data bus lines D are supplied to the terminals 55.

Specifically, as shown in FIG. 19, on the active matrix substrate 5 according to the present embodiment, draw-out lines 51r, 51g, and 51b are provided, for example, in correspondence with the colors R, G, and B, respectively. The draw-out lines 51r, 51g, and 51b are connected to end portions of the data bus lines D corresponding to R, G, and B, respectively, at the non-input side. Drain electrodes, not shown, of the third thin-film transistors 52 are connected to the corresponding draw-out lines 51r, 51g, 51b. Source electrodes (not shown) of the third thin-film transistors 52 are each connected to one of the second common wires 54r, 54g, and 54b, which are provided in correspondence with the colors R, G, and B, respectively, via the connection wire 53 (FIG. 17). In other words, the second common wires 54r, 54g, and 54b are connected to the draw-out lines 51r, 51g, and 51b in correspondence with the colors R, G, and B, respectively, via the third thin-film transistors 52. Furthermore, a predetermined number of R, G, and B data bus lines D are connected to the second common wires 54r, 54g, and 54b, respectively, via a predetermined number of third thin-film transistors 52. In this way, on the active matrix substrate 5 according to the present embodiment, an inspection operation for the data bus lines D can be performed for each of the colors R, G, and B.

That is to say, on the active matrix substrate 5 according to the present embodiment, only one first common wire 47 is provided at the input side of the data bus lines D (i.e., in a section with a portion on which the aforementioned driver chip is mounted). Therefore, in an inspection operation using the first common wire 47, it is possible to detect disconnection of each of the data bus lines D and the draw-out lines 45, failures of first thin-film transistors 18, and the like. However, it is not possible to perform single-color display using R, G, or B and to detect a short circuit between neighboring data bus lines D or between neighboring draw-out lines 45 as in the first embodiment.

In view of this, on the active matrix substrate 5 according to the present embodiment, the three second common wires 54r, 54g, and 54b are provided in correspondence with R, G, and B, respectively, at the non-input side of the data bus lines D. This enables single-color display using R, G, or B and detection of a short circuit between neighboring data bus lines D or between neighboring draw-out lines 45, similarly to the first embodiment. It should be noted that disconnection of the draw-out lines 45 cannot be detected in an inspection using the second common wires 54r, 54g, 54b. For this reason, it is preferable to carry out the inspection in combination with an inspection using the first common wire 47.

Similarly to the first embodiment, on the active matrix substrate 5 according to the present embodiment, voltage can be applied from the second common wires 54r, 54g, 54b at the time of alignment processing for a liquid crystal layer (voltage application processing for implementing the PSA technology), and a time period required for the alignment processing can be reduced by applying voltage simultaneously from the first common wire 47.

With the foregoing configurations, the present embodiment can achieve the functions and effects similar to those achieved by the first embodiment described earlier. In the present embodiment, the third thin-film transistors (third switching elements) 52 and the second common wires 54 are provided. The third thin-film transistors 52 are connected to end portions of the data bus lines D that are not connected to the mounting terminals DT, and the second common wires 54 are connected in common to the plurality of data bus lines D via the third thin-film transistors 52. Accordingly, in the present embodiment, the configurations in a section with the mounting terminals DT, such as the configuration of the aforementioned first common wire 47, can be simplified, and the second thin-film transistors (second switching elements) 46 can be installed more easily even if a region for mounting a driver is small. Furthermore, the present embodiment can downsize the region for mounting the driver. This makes it possible to further downsize the external shape of the active matrix substrate 5, and hence the external shape of the liquid crystal display apparatus 1. Furthermore, the resistance of auxiliary capacitance electrode driving signal wires CS1 for an auxiliary capacitance electrode (common electrode) CS can be reduced by increasing a region for installing the auxiliary capacitance electrode driving signal wires CS1, i.e., by thickening the auxiliary capacitance electrode driving signal wires CS1. As a result, the occurrence of defective display, such as flickering and shadowing, attributed to a delay in signals (voltage signals) to the auxiliary capacitance electrode CS can be inhibited.

Other Embodiments

It should be noted that the embodiments described earlier are all illustrative and not restrictive. The technical scope of the present invention is defined by the claims, and all changes that come within the range of equivalency of the configurations described in the claims are to be embraced within the technical scope of the present invention.

For example, although the present invention is applied to a transmissive liquid crystal display apparatus in the foregoing description, an active matrix substrate of the present invention is not limited in this way. An active matrix substrate of the present invention can be applied to any display apparatus that includes a display region having a plurality of pixels and wires that transmit signals for driving the pixels. For example, the present invention can be adapted into an organic EL display, a microcapsule-type electrophoretic display apparatus, and other display apparatuses. A microcapsule-type electrophoretic display apparatus can display an image by, for example, applying voltage to a microcapsule layer formed in a display region on a pixel-by-pixel basis. A display apparatus can include, for example, a substrate provided with wires for a display region that are connected, via switching elements, to pixel electrodes provided in one-to-one relationship with pixels, and draw-out lines connected to the wires for the display region. This substrate, for example, can be constructed similarly to active matrix substrates according to the embodiments described earlier. Furthermore, an active matrix substrate of the present invention can be applied not only to such a display apparatus, but also to various types of sensor substrates, such as a sensor substrate for an X-ray detection apparatus.

Furthermore, although mounting terminals DT and cross-connection portions 70 are staggered in two rows in the foregoing description, an active matrix substrate of the present invention is not limited in this way. For example, mounting terminals DT or cross-connection portions 70 may be staggered in three rows (i.e., three neighboring mounting terminals DT or cross-connection portions 70 may be sequentially shifted so as to be arranged in different positions along a linear direction).

Furthermore, although the foregoing description involves application to a liquid crystal panel of a CPA mode, which is one type of a homeotropic alignment mode (what is called a liquid crystal panel of a vertical electric field), an active matrix substrate of the present invention is not limited in this way, and can also be applied, for example, to other liquid crystal panels of a homeotropic alignment mode using fishbone-type pixel electrodes, and to liquid crystal panels of a homogeneous alignment mode (what is called liquid crystal panels of a horizontal electric field).

Specifically, given an azimuth system where positive angles are taken counterclockwise starting from 0° pointing at the right side of a horizontal direction (the direction in which gate bus lines extend), a fishbone-type pixel electrode includes a plurality of elongated electrode portions (branch portions) that extend in the angles of, for example, 45°, 135°, 225°, and 315°. Between the elongated electrode portions, an elongated cutout (slit) extending in a corresponding direction is provided. A fishbone-type pixel electrode also includes a backbone portion (stem portion) that is located at a central portion of a pixel and extends along a vertical direction (the direction in which data bus lines extend). Each elongated electrode portion is connected to the backbone portion.

The direction in which the elongated electrode portions (or slits) extend varies with each of four regions that are obtained by dividing a pixel P into quarters, i.e., into two regions in both vertical and horizontal directions. As a result, at the time of voltage application, four liquid crystal alignment regions corresponding to the four regions (liquid crystal alignments in four domains) are formed within one pixel P. Within a liquid crystal domain, the alignment states of liquid crystal molecules are substantially the same. Different domains show different alignment states of liquid crystal molecules.

More specifically, when voltage is applied between a fishbone-type pixel electrode and a counter electrode 20, in each domain, liquid crystal molecules are aligned so as to be inclined parallel to the direction in which the slits extend, with their upper end portions facing the inner side of a pixel P.

In a homeotropic alignment mode using fishbone-type pixel electrodes, objects for alignment control for a counter substrate 4, such as alignment control protrusions CT, are not essential.

Furthermore, it is preferable to implement a homeotropic alignment mode using fishbone-type pixel electrodes in conjunction with the aforementioned polymer sustained alignment (PSA) technology, similarly to a CPA mode.

In a liquid crystal panel of a homogeneous alignment mode, homogeneous alignment films are provided on the inner surfaces of an active matrix substrate 5 and a counter substrate 4, and a liquid crystal layer uses liquid crystals with positive dielectric constant anisotropy. An auxiliary capacitance electrode serving as a common electrode is also used as a counter electrode. In the liquid crystal panel of the homogeneous alignment mode, the alignment of liquid crystals is controlled by forming a plurality of parallel slits (having a width of, for example, 2 µm to 4 µm) in pixel electrodes and generating a horizontal electric field between the pixel electrodes and the aforementioned counter electrode (common electrode). In the homogeneous alignment mode, it is not necessary to form the counter electrode 20 in the counter substrate 4. Furthermore, in the homogeneous alignment mode, the counter electrode serving as the common electrode is made from transparent electrode material and is provided below the pixel electrodes, similarly to the auxiliary capacitance electrode. Moreover, in the homogeneous alignment mode, there is a case in which the counter electrode serving as the common electrode is provided above the pixel electrodes, unlike the auxiliary capacitance electrode. In this case, the aforementioned slits are not formed in the pixel electrodes, and a plurality of parallel slits (having a width of, for example, 2 µm to 4 µm) are formed in the counter electrode.

In the first, third, and fourth embodiments described earlier, gate drivers are monolithically formed on an active matrix substrate. In the second and fifth embodiments described earlier, a gate driver and a data driver composed of a driver chip (driver IC) are arranged on an active matrix substrate. However, an active matrix substrate of the present invention is not limited in this way. For example, in the second and fifth embodiments, gate drivers may be monolithically formed on an active matrix substrate.

In the foregoing description, data bus lines are provided for pixels that each correspond to one of the colors red (R), green (G), and blue (B). However, an active matrix substrate of the present invention is not limited in this way. For example, R, G, and B pixels may be sequentially provided with respect to one data bus line.

Although data bus lines are provided for pixels that each correspond to one of three colors in the foregoing description, four or more colors (e.g., R, G, B, and yellow, or R, G, B, and white) may be used.

Although thin-film transistors are used as first to third switching elements in the foregoing description, switching elements of the present invention are not limited in this way. For example, other field-effect transistors may be used.

In addition to the foregoing description, the first to fifth embodiments described earlier may be combined as appropriate.

INDUSTRIAL APPLICABILITY

The present invention is useful for an active matrix substrate on which wires and elements outside a display region can be efficiently installed while preserving their functions, even when a frame region has been downsized, and also for a display apparatus incorporating such an active matrix substrate.

DESCRIPTION OF REFERENCE NUMERALS

1: liquid crystal display apparatus (display apparatus)
5: active matrix substrate
5*a*: base member 16: data driver
17, 17a, 17b: gate driver
18: first thin-film transistor (first switching element)
19: pixel electrode
22: data bus line draw-out line
23: second thin-film transistor (second switching element)
24: first common wire
26: control line
29: gate insulating film
31, 32, 33: interlayer insulating film
39: first common wire
44: metal electrode (light shielding film)
52: third thin-film transistor (third switching element)
54: second common wire
CS: auxiliary capacitance electrode (common electrode)
D, D1 to DM: data bus line (data wire)
G, G1 to GN: gate bus line (scan wire)
DT: mounting terminal
FA: fan-out portion
H: terminal contact hole

The invention claimed is:

1. An active matrix substrate, comprising:
a base member;
a plurality of gate bus lines provided on the base member;
a plurality of data bus lines provided in a layer different from a layer of the gate bus lines via an insulating film therebetween;
a first switching element connected to the gate bus lines and the data bus lines;
a driver driving input terminal that inputs an input signal to a driver;
a mounting terminal that supplies an output signal from the driver to the gate bus lines or the data bus lines;
a plurality of draw-out lines connecting the mounting terminal and the gate bus lines or the data bus lines;
a plurality of second switching elements that are each connected to a corresponding one of the plurality of draw-out lines; and
a first common wire connected in common to at least two of the plurality of second switching elements, wherein
the draw-out lines include a fan-out portion that is arranged at an angle with respect to a direction of arrangement of the gate bus lines or the data bus lines, and
at least a portion of the first common wire and at least a portion of the second switching elements are arranged between the fan-out portion and the mounting terminal.

2. The active matrix substrate according to claim 1, further comprising:
a third switching element connected to an end portion of the gate bus lines or the data bus lines to which the mounting terminal is not connected; and
a second common wire connected in common to a plurality of third switching elements constituting the third switching element.

3. The active matrix substrate according to claim 2, wherein
the second common wire is defined by a plurality of second common wires, and
a predetermined number of the third switching elements are connected to each of the plurality of second common wires.

4. The active matrix substrate according to claim 1, wherein
the first common wire is constituted by a plurality of first common wires, and
a predetermined number of the second switching elements are connected to each of the plurality of first common wires.

5. The active matrix substrate according to claim 1, wherein
two of the second switching elements that are connected respectively to two neighboring draw-out lines among the draw-out lines are arranged between the two neighboring draw-out lines and are connected while opposing each other via a common control wire.

6. The active matrix substrate according to claim 1, wherein
among the plurality of draw-out lines, one of two neighboring draw-out lines is formed from the same conductive layer as the gate bus lines, and
the other of the two neighboring draw-out lines is formed from the same conductive layer as the data bus lines.

7. The active matrix substrate according to claim 6, wherein
the first common wire is constituted by a plurality of first common wires,
two of the second switching elements that are connected respectively to two neighboring draw-out lines among the draw-out lines formed from the same conductive layer as the gate bus lines are each connected to a different one of the first common wires, and
two of the second switching elements that are connected respectively to two neighboring draw-out lines among the draw-out lines formed from the same conductive layer as the data bus lines are each connected to a different one of the first common wires.

8. The active matrix substrate according to claim 1, further comprising:
an interlayer insulating film provided so as to cover the first switching element, the interlayer insulating film having at least one layer;
a pixel electrode connected to the first switching element;
a common electrode that is made from transparent electrode material and is provided above or below the pixel electrode; and
a metal electrode provided in a layer above or below the common electrode, wherein
at least a portion of the second switching elements is covered by a light shielding film formed from the metal electrode.

9. The active matrix substrate according to claim 1, wherein
an oxide semiconductor is used for both the first and second switching elements.

10. A display apparatus incorporating the active matrix substrate according to claim 1.

11. The display apparatus according to claim 10, further comprising:
a counter substrate, wherein
the second switching elements are not covered by the counter substrate.

12. The display apparatus according to claim 10, further comprising:
a driver chip, wherein
the second switching elements are not covered by the driver chip.

* * * * *